(12) United States Patent
Hanft

(10) Patent No.: US 8,149,114 B2
(45) Date of Patent: *Apr. 3, 2012

(54) UTILITY METER TAMPER MONITORING SYSTEM AND METHOD

(75) Inventor: Jeffrey John Hanft, Commerce Township, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/033,619

(22) Filed: Feb. 24, 2011

(65) Prior Publication Data

US 2011/0193678 A1    Aug. 11, 2011

Related U.S. Application Data

(63) Continuation of application No. 12/702,316, filed on Feb. 9, 2010.

(51) Int. Cl.
*G08B 1/08* (2006.01)
(52) U.S. Cl. .................................. 340/539.14
(58) Field of Classification Search ............... 340/573.4, 340/539.1, 10.1, 825.69, 539.14, 870.02
See application file for complete search history.

(56) References Cited

U.S. PATENT DOCUMENTS

| | | | |
|---|---|---|---|
| 3,466,077 A | 9/1969 | Moberg |
| 3,467,427 A | 9/1969 | Moberg |
| 3,485,521 A | 12/1969 | Moberg |
| 3,588,963 A | 6/1971 | Moberg |
| 3,589,406 A | 6/1971 | Moberg |
| 3,633,957 A | 1/1972 | Moberg |
| 3,752,633 A | 8/1973 | Lundberg |
| 3,830,538 A | 8/1974 | Moberg |
| 3,911,970 A | 10/1975 | Lundberg |
| 4,424,995 A | 1/1984 | Guiler |
| 4,441,233 A | 4/1984 | Swift |
| 4,446,603 A | 5/1984 | Guiler |
| 4,460,203 A | 7/1984 | Moberg |
| 4,500,124 A | 2/1985 | Swift |
| 4,506,415 A | 3/1985 | Swift |
| 4,506,921 A | 3/1985 | Swift |

(Continued)

FOREIGN PATENT DOCUMENTS

EP        0173127 A3      7/1986

(Continued)

OTHER PUBLICATIONS

"ELEC5515 Gigabit Wireless Systems" Dr. Jeff Li; pp. 31; (Last Visited: Feb. 23. 2011).

(Continued)

*Primary Examiner* — Phung Nguyen
(74) *Attorney, Agent, or Firm* — Raj Abbyanker, P.C.

(57) ABSTRACT

A method includes activating a tamper monitoring circuit of a security seal configured to securely lock a utility meter. The method also includes wirelessly transmitting an identification data and/or an integrity information associated with the security seal and/or the utility meter to the external transceiver upon activating the tamper monitoring circuit or being queried by the external transceiver through a transceiver of the tamper monitoring circuit. The transceiver of the tamper monitoring circuit and the external transceiver are configured to securely communicate with each other through a secure protocol. Further, the method includes detecting a tamper condition associated with tampering of the security seal through the tamper monitoring circuit, and wirelessly transmitting data associated with the tamper condition to the external transceiver.

4 Claims, 15 Drawing Sheets

U.S. PATENT DOCUMENTS

| | | | |
|---|---|---|---|
| 4,544,190 A | 10/1985 | Swift et al. | |
| 4,586,570 A | 5/1986 | Swift | |
| 4,588,218 A | 5/1986 | Guiler et al. | |
| 4,600,220 A | 7/1986 | Agnelli | |
| 4,674,304 A | 6/1987 | Guiler | |
| 4,687,240 A | 8/1987 | Swift | |
| 4,775,175 A | 10/1988 | Swift | |
| 4,782,613 A | 11/1988 | Guiler et al. | |
| 4,793,644 A | 12/1988 | Swift | |
| 4,811,977 A | 3/1989 | Swift et al. | |
| 4,832,387 A | 5/1989 | Guiler | |
| 4,836,590 A | 6/1989 | Swift | |
| 4,893,853 A | 1/1990 | Guiler | |
| 4,909,552 A | 3/1990 | Weber et al. | |
| 4,950,007 A | 8/1990 | Swift | |
| 4,978,026 A | 12/1990 | Gnoinski | |
| 4,982,985 A | 1/1991 | Atlas | |
| 5,005,883 A | 4/1991 | Guiler | |
| 5,116,091 A | 5/1992 | Swift | |
| 5,127,687 A | 7/1992 | Guiler | |
| 5,180,200 A | 1/1993 | Georgopoulos et al. | |
| 5,183,301 A | 2/1993 | Lundberg, Jr. | |
| 5,222,776 A | 6/1993 | Georgopoulos et al. | |
| 5,301,524 A | 4/1994 | Georgopoulos et al. | |
| 5,306,054 A | 4/1994 | Georgopoulos | |
| 5,314,219 A | 5/1994 | Georgopoulos et al. | |
| 5,347,689 A | 9/1994 | Georgopoulos et al. | |
| 5,378,030 A | 1/1995 | Georgopoulos et al. | |
| 5,413,393 A | 5/1995 | Georgopoulos et al. | |
| 5,419,599 A | 5/1995 | Georgopoulos | |
| 5,427,423 A | 6/1995 | Georgopoulos | |
| 5,441,316 A | 8/1995 | Georgopoulos | |
| 5,448,230 A | 9/1995 | Schanker et al. | |
| 5,450,657 A | 9/1995 | Georgopoulos et al. | |
| 5,522,627 A | 6/1996 | Swift | |
| 5,524,945 A | 6/1996 | Georgopoulos et al. | |
| 5,533,767 A | 7/1996 | Georgopoulos et al. | |
| 5,582,447 A | 12/1996 | Leon et al. | |
| 5,788,294 A | 8/1998 | Leon et al. | |
| 5,884,949 A | 3/1999 | Leon et al. | |
| 5,959,568 A | 9/1999 | Woolley | |
| 6,000,736 A | 12/1999 | Leon et al. | |
| 6,007,121 A | 12/1999 | Dreisbach et al. | |
| 6,037,880 A | 3/2000 | Manion | |
| 6,317,025 B1 | 11/2001 | Leon et al. | |
| 6,345,847 B1 | 2/2002 | Dreisbach et al. | |
| 6,390,519 B1 | 5/2002 | Dreisbach et al. | |
| 6,449,808 B1 | 9/2002 | Zappa et al. | |
| 6,491,328 B1 | 12/2002 | Dreisbach | |
| 6,494,508 B1 | 12/2002 | Dreisbach et al. | |
| 6,511,108 B1 | 1/2003 | Roessner, III et al. | |
| 6,741,176 B2 | 5/2004 | Ferraro et al. | |
| 6,752,439 B1 | 6/2004 | Lundberg et al. | |
| 6,791,465 B2 | 9/2004 | Blagin et al. | |
| 6,966,584 B2 | 11/2005 | Debrody et al. | |
| 6,981,725 B2 | 1/2006 | Debrody et al. | |
| 7,046,985 B2 | 5/2006 | Seales et al. | |
| 7,135,973 B2 | 11/2006 | Kittel et al. | |
| 7,239,238 B2 | 7/2007 | Tester et al. | |
| 7,432,823 B2 | 10/2008 | Soni | |
| 7,471,203 B2 | 12/2008 | Worthy et al. | |
| 7,477,146 B2 | 1/2009 | Auerbach | |
| 7,495,544 B2 | 2/2009 | Stilp | |
| 7,586,888 B2 | 9/2009 | Wang | |
| 7,595,727 B2 | 9/2009 | Grijalva et al. | |
| 7,616,116 B2 | 11/2009 | Ehrensvard et al. | |
| 7,644,290 B2 | 1/2010 | Ransom | |
| 7,659,816 B2 | 2/2010 | Wandel | |
| 7,663,502 B2 | 2/2010 | Breed | |
| 7,683,789 B2 | 3/2010 | Stewart et al. | |
| 7,782,200 B1 | 8/2010 | Fleischmann | |
| 7,791,452 B2 | 9/2010 | Carrieri | |
| 7,800,497 B2 | 9/2010 | Marusak et al. | |
| 7,825,793 B1 | 11/2010 | Spillman | |
| 7,847,703 B2 | 12/2010 | Bauschke et al. | |
| 7,848,362 B2 * | 12/2010 | Picard ..................... 370/509 | |
| 2003/0184436 A1 * | 10/2003 | Seales et al. ................. 340/531 | |
| 2006/0220842 A1 | 10/2006 | Breed | |
| 2007/0247789 A1 | 10/2007 | Benson et al. | |
| 2008/0036596 A1 | 2/2008 | Auerbach et al. | |
| 2008/0272934 A1 * | 11/2008 | Wang et al. ................. 340/870.11 |
| 2008/0291019 A1 | 11/2008 | Auerbach et al. | |
| 2009/0135015 A1 | 5/2009 | Dobson et al. | |
| 2009/0153356 A1 | 6/2009 | Holt | |
| 2009/0199606 A1 | 8/2009 | Gil et al. | |
| 2009/0315399 A1 * | 12/2009 | Shikata ..................... 307/38 |
| 2009/0322510 A1 | 12/2009 | Berger et al. | |
| 2010/0013635 A1 | 1/2010 | Berger et al. | |
| 2010/0141435 A1 | 6/2010 | Breed | |
| 2010/0145536 A1 | 6/2010 | Masters et al. | |
| 2010/0164710 A1 | 7/2010 | Chung et al. | |
| 2010/0164719 A1 | 7/2010 | George et al. | |
| 2010/0164720 A1 | 7/2010 | Kore | |
| 2010/0295672 A1 | 11/2010 | Hyland et al. | |
| 2010/0315233 A1 | 12/2010 | Eichenstein et al. | |

FOREIGN PATENT DOCUMENTS

| | | | |
|---|---|---|---|
| EP | 0223905 A1 | 6/1987 | |
| EP | 0379659 A2 | 8/1990 | |
| EP | 0423831 A2 | 4/1991 | |
| EP | 0379659 A3 | 8/1991 | |
| EP | 0423831 A3 | 8/1991 | |
| EP | 0223905 B1 | 10/1991 | |
| EP | 0458157 A1 | 11/1991 | |
| EP | 0540475 A2 | 5/1993 | |
| EP | 0540475 A3 | 7/1993 | |
| EP | 0667826 A1 | 5/1994 | |
| EP | 0423831 B1 | 7/1994 | |
| EP | 0458157 B1 | 8/1994 | |
| EP | 0629792 A2 | 12/1994 | |
| EP | 0708954 A1 | 12/1994 | |
| EP | 0708954 B1 | 12/1994 | |
| EP | 0633556 A1 | 1/1995 | |
| EP | 0634735 A1 | 1/1995 | |
| EP | 0713596 A1 | 2/1995 | |
| EP | 0379659 B1 | 8/1995 | |
| EP | 0667826 A4 | 9/1995 | |
| EP | 0754336 A1 | 10/1995 | |
| EP | 0173127 A2 | 3/1996 | |
| EP | 0797819 A1 | 6/1996 | |
| EP | 0811125 A1 | 8/1996 | |
| EP | 0667826 B1 | 7/1997 | |
| EP | 0786753 A2 | 7/1997 | |
| EP | 0958444 A1 | 6/1998 | |
| EP | 0786753 A3 | 8/1998 | |
| EP | 0861994 A2 | 9/1998 | |
| EP | 0754336 B1 | 6/1999 | |
| EP | 1074011 A1 | 11/1999 | |
| EP | 0861994 A3 | 1/2000 | |
| EP | 0797819 B1 | 6/2000 | |
| EP | 1183673 A2 | 6/2000 | |
| EP | 0811125 B1 | 10/2001 | |
| EP | 1307870 A2 | 2/2002 | |
| EP | 0786753 B1 | 5/2002 | |
| EP | 0861994 B1 | 10/2002 | |
| EP | 1074011 B1 | 7/2004 | |
| EP | 1949346 A1 | 5/2007 | |
| EP | 1708929 A4 | 6/2007 | |
| EP | 1307870 B1 | 10/2007 | |
| WO | 9411265 A1 | 5/1994 | |
| WO | 9429833 A1 | 12/1994 | |
| WO | 9505653 A1 | 2/1995 | |
| WO | 9527968 A2 | 10/1995 | |
| WO | 9527968 A3 | 10/1995 | |
| WO | 9618985 A1 | 6/1996 | |
| WO | 9626372 A1 | 8/1996 | |
| WO | 9727118 A1 | 7/1997 | |
| WO | 9825000 A1 | 6/1998 | |
| WO | 9838088 A1 | 9/1998 | |
| WO | 9957702 A1 | 11/1999 | |
| WO | 9957702 C1 | 11/1999 | |
| WO | 0033283 A2 | 8/2000 | |
| WO | 0033283 A3 | 8/2000 | |
| WO | 0127906 A1 | 4/2001 | |
| WO | 0139162 A1 | 5/2001 | |
| WO | 0148393 A1 | 7/2001 | |
| WO | 0169578 A1 | 9/2001 | |

| | | | |
|---|---|---|---|
| WO | 0195295 A2 | 12/2001 |
| WO | 0195295 A3 | 12/2001 |
| WO | 0195295 C2 | 12/2001 |
| WO | 0213165 A2 | 2/2002 |
| WO | 0213165 A3 | 2/2002 |
| WO | 2004032101 A1 | 4/2004 |
| WO | 2005072410 A3 | 8/2005 |
| WO | 2007/059161 A1 | 5/2007 |
| WO | 2010100392 A1 | 9/2010 |

OTHER PUBLICATIONS

"Advanced Metering Infrastructure for the Utility Industry" ; (Last Visited : Feb. 23, 2011).

"Recommended Practices Guide for Securing ZigBee Wireless Networks in Process Control System Environments" Ken Masic ; Apr. 2007 ; (Last Visited : Feb. 23, 2011).

"Modernising meter readings, data collection systems" ; Mohit Arora ; (Last Visited : Feb. 23, 2011).

"Program analysis for cache coherence: beyond procedural boundaries" ; Choi, L. Pen-Chung Yew ;Aug. 6, 2002 ; (Last Visited : Feb. 23, 2011).

"Feasibility study of zigbee-based automatic meter reading system for the provincial electricity authority" Joon Joongwong; (Last Visited : Feb. 23, 2011).

"Secure Communications in the Smart Grid" Jeff Naruchitparames and Mehmet Hadi G une ;(Last Visited : Feb. 23, 2011).

"A Study of IEEE 802.15.4 Security Framework for Wireless Body Area Network" Sana Ullah; Feb. 3, 2011 ; (Last Visited : Feb. 23, 2011).

* cited by examiner

UTILITY METER TAMPER MONITORING SYSTEM AND METHOD

CLAIM OF PRIORITY

This is an accelerated examination application and claims priority to U.S. Utility application Ser. No. 12/702,316 titled "UTILITY METER TAMPER MONITORING SYSTEM AND METHOD", filed on Feb. 9, 2010;

FIELD OF TECHNOLOGY

This disclosure relates generally to security seals for utility meters and, more particularly, to a method, an apparatus, and/or a system of a secure, low-power seal tamper monitoring system.

BACKGROUND

A utility meter (e.g., electricity meter, gas meter, water meter) may be associated with a physical structure (e.g., official/residential/commercial building, home). The utility meter may monitor usage of resources (e.g., electricity, gas, water) therein. To prevent tampering of the utility meter, a plastic lock may be provided to secure the utility meter. If the utility meter has been tampered with, the plastic lock may be compromised (e.g., broken, damaged). The compromised plastic lock may be detected during periodic (e.g., monthly) inspection of the utility meter.

The longer the period between consecutive inspections, the greater the likelihood of losses due to the utility meter tampering. As the world moves toward more intelligent electrical networks, inspections may be conducted less frequently because intelligent meters may communicate usage directly through a wide area network (WAN). Therefore, utility companies may reduce staff required to conduct physical inspections due to high labor cost, competition, and/or inefficiencies. Thus, the plastic lock may be compromised for months before being detected. This may result in greater exposure to tamper-related financial losses.

SUMMARY

Disclosed are a method, an apparatus, and/or a system of a secure, low-power seal tamper monitoring system.

In one aspect, a method includes activating a tamper monitoring circuit of a seal configured to securely lock a utility meter through a reception of a locking portion inside a housing of the seal and/or a communication through an external transceiver upon secure locking of the utility meter. The reception of the locking portion inside the housing of the seal causes a conductive material of the locking portion to contact a conductive portion of the tamper monitoring circuit to complete an electrical coupling between a power source of the tamper monitoring circuit and the tamper monitoring circuit.

The method also includes wirelessly transmitting an identification data and/or an integrity information associated with the seal and/or the utility meter to the external transceiver upon activating the tamper monitoring circuit or being queried by the external transceiver following the activation of the tamper monitoring circuit through a transceiver of the tamper monitoring circuit. The transceiver of the tamper monitoring circuit and the external transceiver are configured to securely communicate with each other through a protocol configured to enable the transceiver of the tamper monitoring circuit and the external transceiver to wait for a period of time when a channel is busy before attempting to transmit through the channel or transmit using another channel when the channel is busy.

The channel signifies a frequency in a frequency band of communication between the transceiver of the tamper monitoring circuit and the external transceiver. Further, the method includes detecting a tamper condition associated with tampering of the seal through the tamper monitoring circuit, and wirelessly transmitting data associated with the tamper condition upon detecting the tamper condition through the tamper monitoring circuit or being queried by the external transceiver through the transceiver of the tamper monitoring circuit.

In another aspect, a seal includes a housing, a locking portion, and a tamper monitoring circuit. The locking portion is configured to securely lock a utility meter through a reception thereof inside the housing of the seal. The tamper monitoring circuit is configured to be activated through the reception of the locking portion inside the housing and/or a communication through an external transceiver upon secure locking of the utility meter.

The tamper monitoring circuit includes a transceiver configured to wirelessly transmit an identification data and/or an integrity information associated with the seal and/or the utility meter to the external transceiver upon activating the tamper monitoring circuit or being queried by the external transceiver following the activation of the tamper monitoring circuit. The transceiver of the tamper monitoring circuit and the external transceiver are configured to securely communicate with one another through a protocol configured to enable the transceiver of the tamper monitoring circuit and the external transceiver to wait for a period of time when a channel is busy before attempting to transmit through the channel or transmit using another channel when the channel is busy.

The channel signifies a frequency in a frequency band of communication between the transceiver of the tamper monitoring circuit and the external transceiver. The tamper monitoring circuit is configured to detect a tamper condition associated with tampering of the seal, and the transceiver of the tamper monitoring circuit is configured to wirelessly transmit data associated with the tamper condition upon detecting the tamper condition through the tamper monitoring circuit or being queried by the external transceiver.

In yet another aspect, a tamper monitoring system includes a wireless network. The wireless network includes a number of external transceivers as gateways thereof and a number of seals associated with each external transceiver. The number of external transceivers is configured such that individual external transceivers communicate data not only between the number of seals associated therewith but also between other external transceivers within a mutual radio transmission range.

Each seal includes a housing, a locking portion, and a tamper monitoring circuit. The locking portion is configured to securely lock a utility meter through a reception thereof inside the housing. The tamper monitoring circuit is configured to be activated through the reception of the locking portion inside the housing and/or a communication through the external transceiver associated therewith upon secure locking of the utility meter.

The tamper monitoring circuit includes a transceiver configured to wirelessly transmit an identification data and/or an integrity information associated with the security seal and/or the utility meter associated therewith to the external transceiver associated therewith upon activating the tamper monitoring circuit or being queried by the external transceiver associated therewith following the activation of the tamper monitoring circuit.

The transceiver of the tamper monitoring circuit and the external transceiver associated therewith are configured to securely communicate with one another through a protocol configured to enable the transceiver of the tamper monitoring circuit and the external transceiver associated therewith to wait for a period of time when a channel is busy before attempting to transmit through the channel or transmit using another channel when the channel is busy.

The channel signifies a frequency in a frequency band of communication between the transceiver of the tamper monitoring circuit and the external transceiver associated therewith. The tamper monitoring circuit is configured to detect a tamper condition associated with tampering of the seal, and the transceiver of the tamper monitoring circuit is configured to wirelessly transmit data associated with the tamper condition upon detecting the tamper condition through the tamper monitoring circuit or being queried by the external transceiver associated therewith.

Further, in another aspect, a resource monitoring system includes a physical structure comprising one or more utility meter(s) associated therewith, a computer network, and a utility payment server communicatively coupled with the one or more utility meter(s) associated with the physical structure through the computer network. The one or more utility meter(s) include a seal configured to securely lock the one or more utility meter(s) and to securely communicate a tamper condition associated with tampering thereof to the utility payment server.

The seal includes a tamper monitoring circuit configured to be activated through a reception of a locking portion inside a housing of the seal and/or a communication through an external transceiver associated with the utility payment server upon secure locking of the one or more utility meter(s). A transceiver of the tamper monitoring circuit and the external transceiver associated with the utility payment server are configured to securely communicate with one another through a protocol configured to enable the transceiver of the tamper monitoring circuit and the external transceiver to wait for a period of time when a channel is busy before attempting to transmit through the channel or transmit using another channel when the channel is busy.

The channel signifies a frequency in a frequency band of communication between the transceiver of the tamper monitoring circuit and the external transceiver.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to realize a secure, low-power seal tamper monitoring system. Although the present embodiments have been described with reference to specific example embodiments, it will be evident that various modifications and changes may be made to these embodiments without departing from the broader spirit and scope of the various embodiments.

Multiple utility meters inside buildings may have multiple seals associated therewith. These multiple seals may, in turn, have multiple tamper monitoring circuits (e.g., Radio-Frequency Identification (RFID) tags) associated therewith. When there is simultaneous transmission between multiple seals and associated tracking units, interference may cause errors/failures in data reception at the tracking units.

Figure 1:
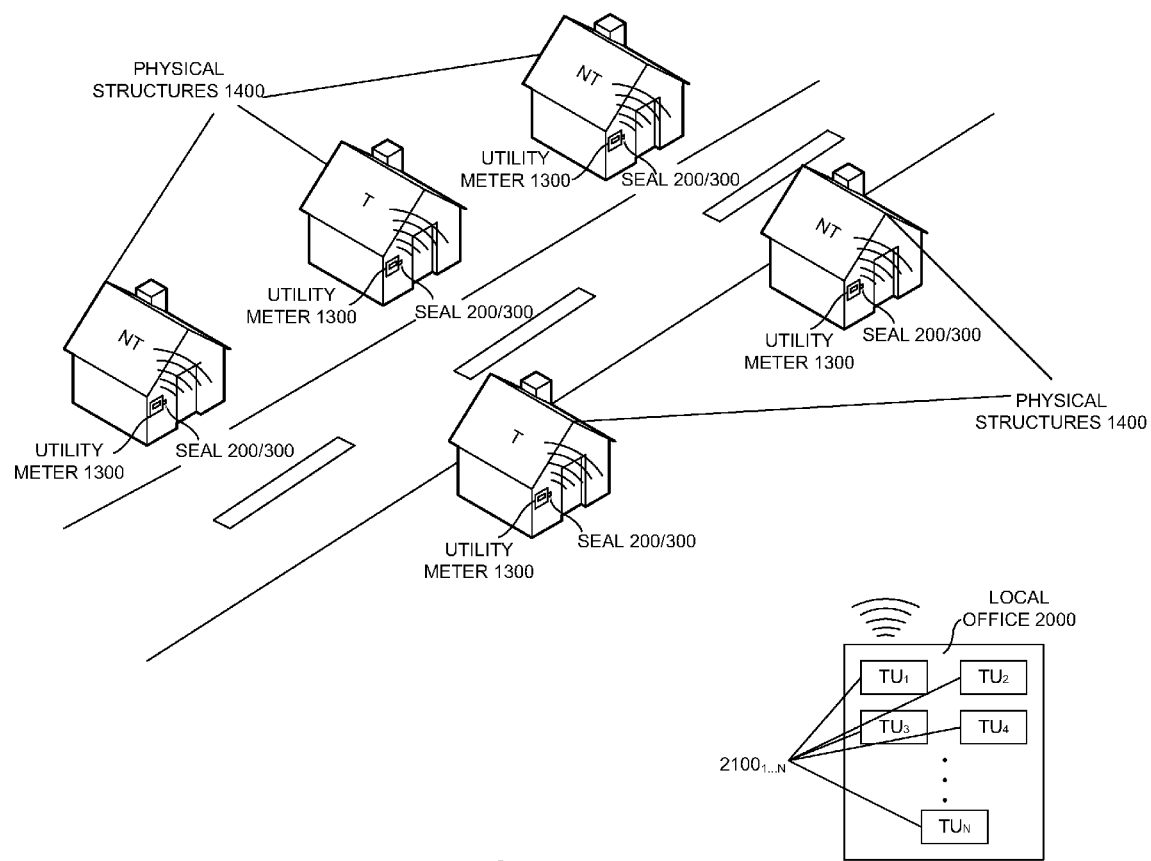
FIG. 1 is a schematic view of utility meters associated with physical structures, according to one or more embodiments.

FIG. 1 shows a local region (e.g., a street) including a number of physical structures 1400 (e.g., buildings) having utility meters 1300 associated therewith. In one or more embodiments, the physical structures may be residential, official, and/or commercial. FIG. 1 shows each physical structure 1400 as having a single utility meter 1300 associated therewith. It is obvious that each physical structure 1400 (e.g., an apartment complex) may have a number of utility meters 1300 associated therewith, and such variations are well within the scope of the exemplary embodiments. In one or more embodiments, each utility meter 1300 may have a seal 200/300 associated therewith configured to transmit identification data, integrity information and/or tamper conditions, as will be discussed below.

FIG. 1 also shows the tamper status of utility meters 1300 associated with physical structures 1400. A tampered state is shown as T and a non-tampered state is shown as NT. The seals 200/300 are also shown as wirelessly transmitting data to local office 2000. In one or more embodiments, local office 2000 may be the local office of the utility service provider. In one or more embodiments, local office 2000 may include tracking units (e.g., $TU_1 \ldots TU_N$, $2100_{1 \ldots N}$) associated therewith configured to communicate with seals 200/300. Thus, in one or more embodiments, wireless communication may occur between seals 200/300 and the tracking units.

Figure 2:
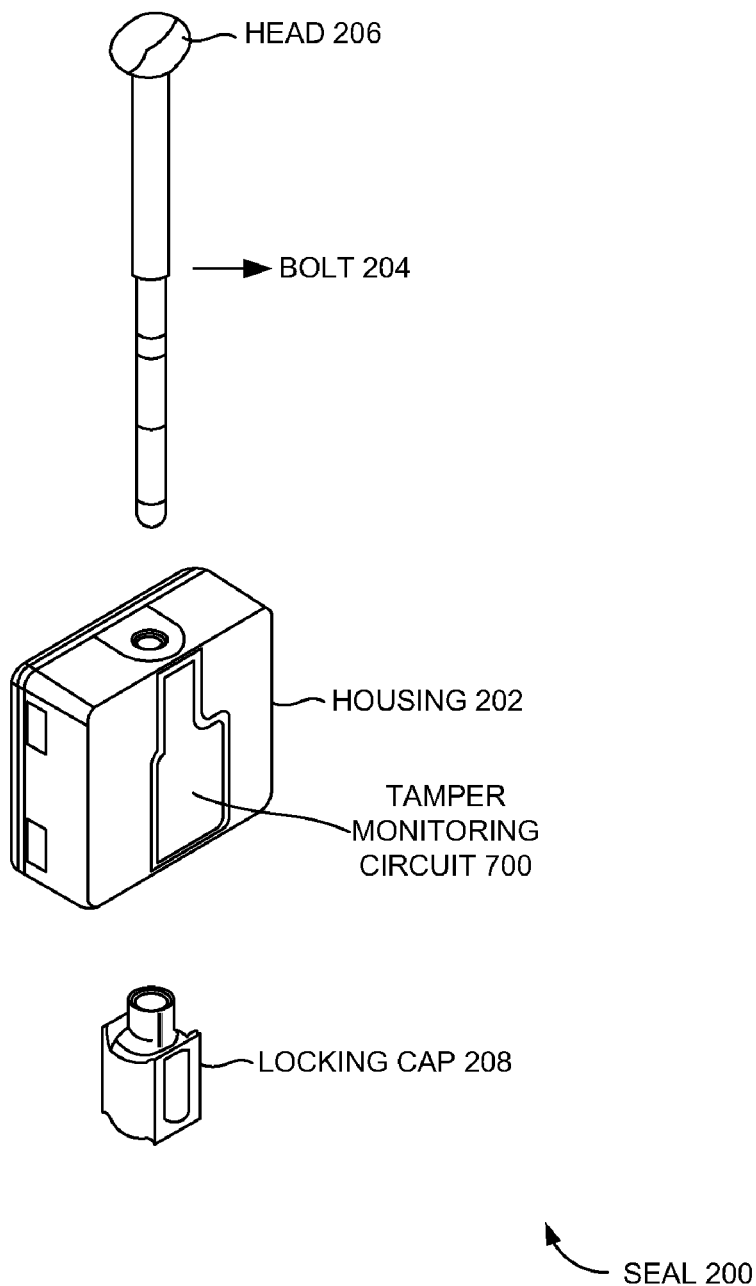
FIG. 2 is a schematic view of a seal in the unlocked state, according to one or more embodiments.

FIG. 2 shows a seal 200 in an unlocked state, according to one or more embodiments. In one or more embodiments, seal 200 includes a housing 202 configured to receive a bolt 204 therethrough. In one or more embodiments, bolt 204 may be disposable. In one or more embodiments, housing 202 may include a locking mechanism (not shown) configured to secure bolt 204 within housing 202 during a locked state. In one or more embodiments, bolt 204 may pass through elements (e.g., locking hasps) of a utility meter 1300 before being received in housing 202 in the locked state. In one or more embodiments, housing 202 may include a circuit configured to communicate identification data associated with seal 200 and/or the utility meter 1300 (e.g., electricity meter, gas meter, water meter) to a tracking unit $2100_{1 \ldots N}$. In one or more embodiments, the identification data (e.g., unique seal number) may be electronically hard-coded into a data bank thereof. In one or more embodiments, the aforementioned circuit (e.g., tamper monitoring circuit 700 to be discussed below) may also be configured to communicate a "tamper" data (e.g., tamper signal) associated with tampering (e.g., by way of breaking bolt 204) of the utility meter 1300 to the tracking unit. In one or more embodiments, the circuit may be battery powered, and may be armed when bolt 204 is locked in housing 202 by way of the locking mechanism.

In one or more embodiments, therefore, provisions to "wake up" the circuit may be provided through the reception of bolt 204 inside housing 202, which may cause a conductive path to be effected between the battery (or, batteries) and the circuit. In one or more embodiments, the circuit may be completely inactive prior to the "waking up." In one or more embodiments, bolt 204 may be at least partially made of a conductive material and/or may include a conductive material inside a protective insulation casing.

In one or more embodiments, the circuit may include an interface for programming the circuit with the identification data. In one or more embodiments, once the circuit is "woken up," the circuit may be configured to transmit an encoded signal associated with the identification information thereof to the tracking unit. In one or more embodiments, the transmission between the circuit and the tracking unit may be periodic. In one or more embodiments, the identification information and, hence, the encoded signal, may also be changed periodically for increased security purposes. In one or more embodiments, the circuit may include a processor and a memory (e.g., Electrically Erasable Programmable Read-Only Memory (EEPROM)), which may be programmed as described above.

In one or more embodiments, the tampering of bolt 204 may cause the transmission of the encoded signal associated with the identification information to be disabled, and the circuit may be configured to transfer data associated with the tampering to the tracking unit $2100_{1 \ldots N}$. In one or more embodiments, the tracking unit $2100_{1 \ldots N}$ may be part of the building 1400 in the premises of which the utility meter 1300 resides or may be outside the building 1400 but within the line of sight (LOS) of the antenna associated with the circuit inside seal 200.

In one or more embodiments, bolt 204 may have a head 206 configured to aid in locking/unlocking of seal 200. In one or more embodiments, head 206 may be removable, and may be made of insulating material. In one or more embodiments, alternately, head 206 may include conductive material covered by an insulation coating. In one or more embodiments, housing 202 may be made of plastic, and may be impact resistant. In one or more embodiments, security seal 200 may also include a locking cap 208 configured to lock seal 200 in a state of locking.

Figure 3:
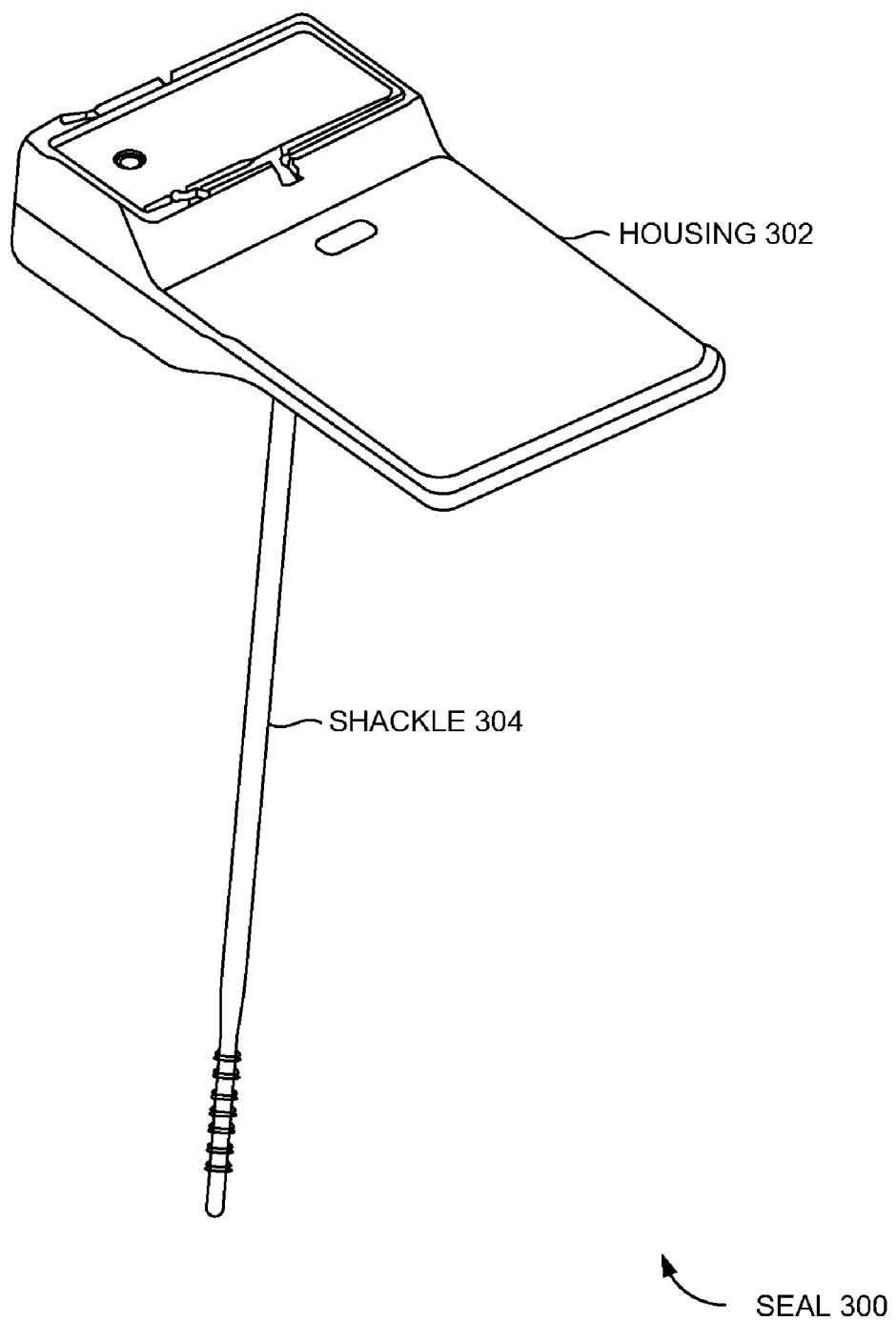
FIG. 3 is a schematic view of a seal in the unlocked state, according to one or more embodiments.
Figure 4:
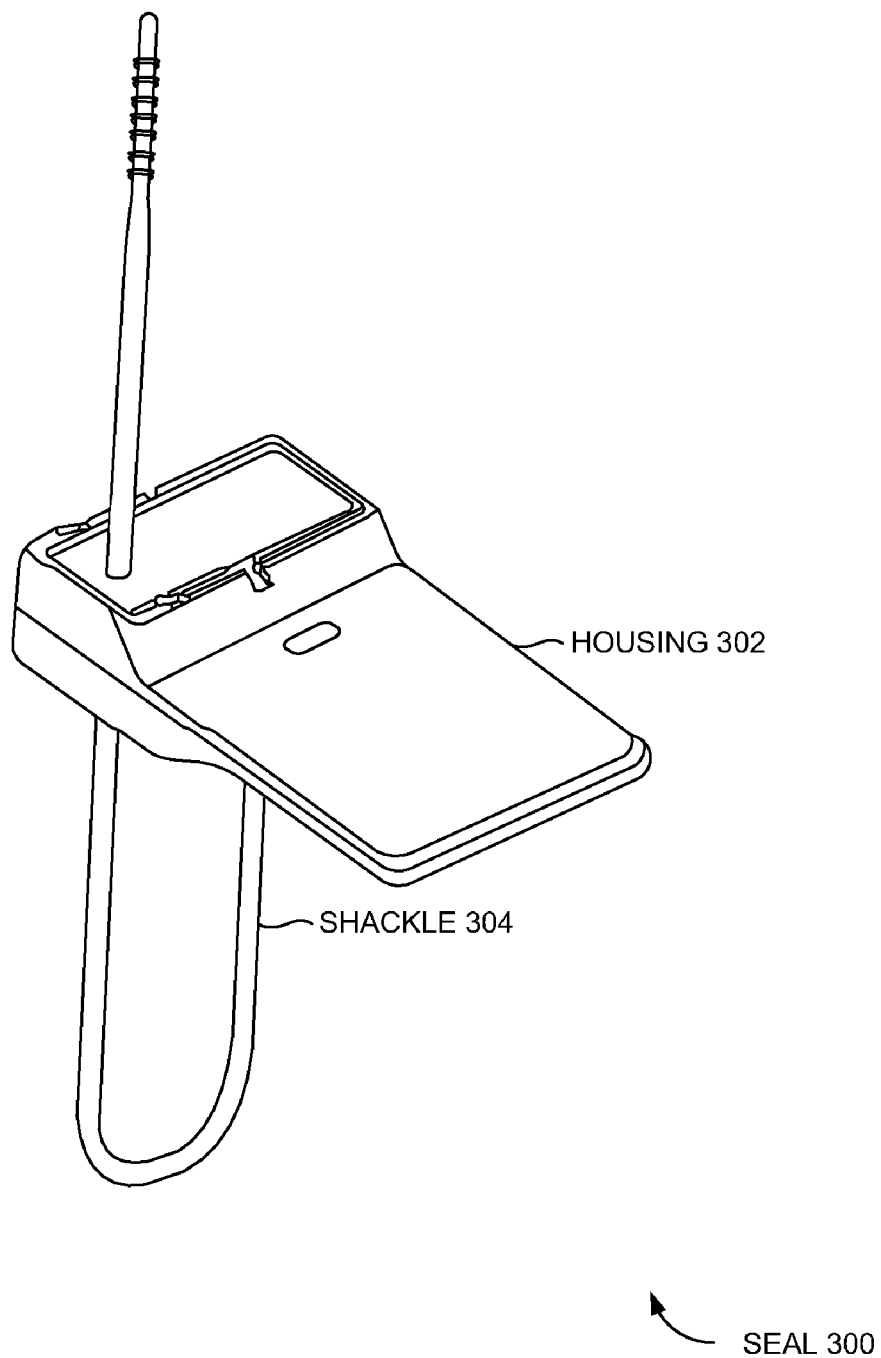
FIG. 4 is a schematic view of the seal of FIG. 3 in the locked state, according to one or more embodiments.

FIG. 3 shows a seal 300 in an unlocked state, according to one or more embodiments. In one or more embodiments, seal 300 includes housing 302, to which a shackle 304 is attached. In one or more embodiments, seal 300 may be available to a customer in the form shown in FIG. 3. Alternately, in one or more embodiments, shackle 304 may be available as a separate element. In one or more embodiments, housing 302 may be configured to receive the free end of shackle 304 through an inside thereof. In one or more embodiments, housing 302 may include a locking mechanism configured to secure shackle 304, which may pass through elements (e.g., locking hasps) of a utility meter 1300 prior to being received through housing 302, in the locked state. Shackle 304, for example, may be drawn tightly about locking hasps of the utility meter 1300 to secure the utility meter 1300 in the locked state. FIG. 4 shows seal 300 in the locked state, according to one or more embodiments. In one or more embodiments, the free end of shackle 304, after being received and locked inside housing 302, may protrude on an outside thereof, and the tightened state of shackle 304 may serve to confirm the locked state of the utility meter 1300.

In one or more embodiments, housing 302 may include a circuit (not shown) configured to monitor tampering associated with shackle 304. In one or more embodiments, shackle 304 may be made of an electrically conductive material. Therefore, in one or more embodiments, the reception of shackle 304 through housing 302 (e.g., through insertion) may arm the circuit, akin to the arming of circuit in seal 200. In one or more embodiments, shackle 304 may be injection molded, and may include an electrically conductive plastic (e.g., polypropylene, polyamide including electrically conductive carbon particles, polyaniline). In one or more embodiments, shackle 304 may include electrically conductive plastic coated with insulating material to shield the system from potential short circuits.

In one or more embodiments, as shackle 304 may include electrically conductive material, an electrically conductive path is formed between conductive terminals inside housing 302, one of which shackle 304 may contact to arm the circuit discussed above. In one or more embodiments, shackle 304 may be in contact with the other conductive terminal inside housing 302 in the unlocked state of FIG. 3. In one or more embodiments, therefore, shackle 304 may form an active resistance that may be measured as discussed below. In one or more embodiments, the adjustable length of shackle 304 may be used in monitoring the integrity of seal 300.

Figure 5:
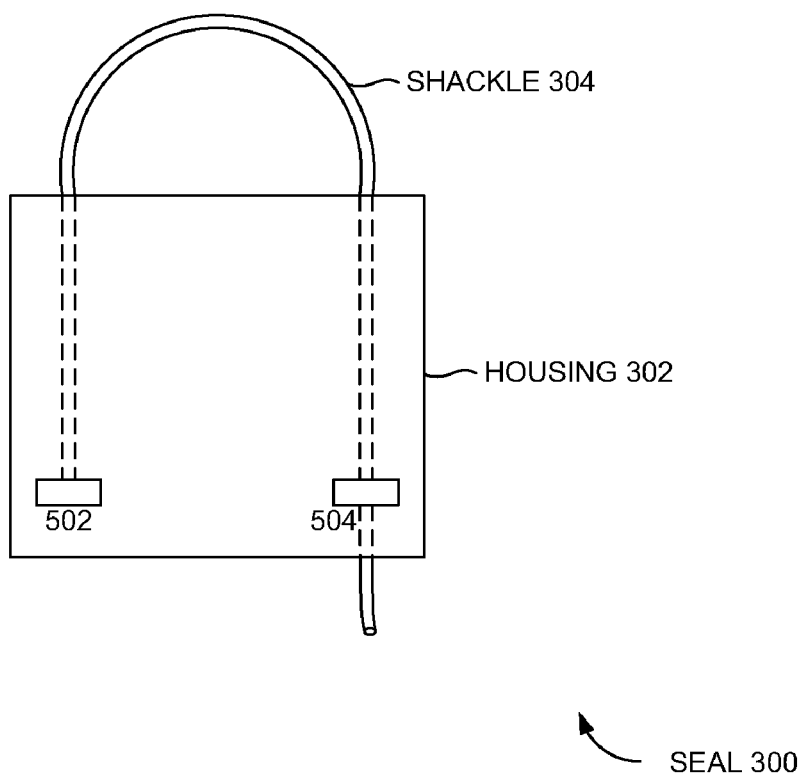
FIG. 5 is a schematic view of the locked state configuration of the seal of FIG. 3, according to one or more embodiments.
Figure 6:
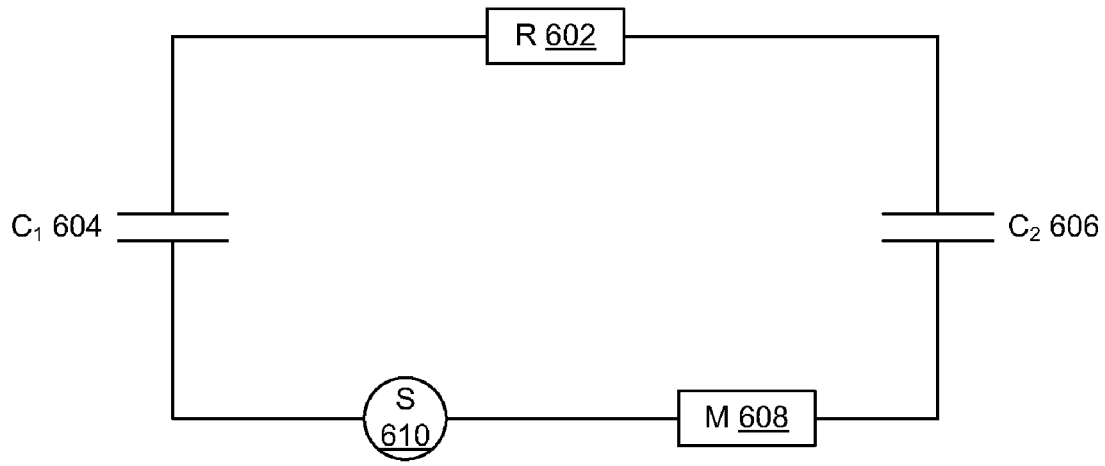
FIG. 6 is a schematic view of the equivalent electrical circuit representation of the locked state configuration of FIG. 5, according to one or more embodiments.

FIG. 5 shows a schematic view of the locked state configuration of seal 300, according to one or more embodiments. In one or more embodiments, the length of shackle 304 between the conductive terminals (502, 504) may be monitored. In one or more embodiments, the terminal to which shackle 304 may make contact with in the unlocked state may, alternately, be a printed conductor or a direct contact terminal to which one end of shackle 304 may be soldered. FIG. 6 shows the equivalent electrical circuit representation of the locked state configuration of FIG. 5, according to one or more embodiments. In one or more embodiments, the portion of shackle 304 between the conductive terminals (502, 504) may contribute to a resistance R 602. In one or more embodiments, the coupling of shackle 304 to respective terminals (502, 504) may contribute to capacitances $C_1$ 604 and $C_2$ 606. In one or more embodiments, as shackle 304 may be pulled through terminal 504 to realize the locked state, the length of shackle 304 configured to provide an active resistance may be varied. In one or more embodiments, when the terminal to which shackle 304 may make contact with in the unlocked state is a printed conductor or a direct contact terminal to which one end of shackle 304 may be soldered, as discussed above, shackle 304 may be directly electrically coupled to a measuring circuit M 608 or a signal source S 610 (see FIG. 6). Here, there is no capacitance between signal source S 610 or measuring circuit M 608 and the resistance R 602, i.e., $C_1$ 604 is non-existent. Therefore, in one or more embodiments, the equivalent circuit representation of the locked state configuration of FIG. 5 may be an RC circuit whose equivalent impedance, Z(f), may be expressed in example Equation 1 as:

$$Z(f) = \sqrt{\left(R^2 + \frac{1}{(2\pi f C_2)^2}\right)}, \quad (1)$$

where Z(f) is the equivalent impedance as a function of frequency, and f is the frequency.

In one or more embodiments, assuming that $C_2$ 606 and R 602 are constant, measurements at two frequencies $f_1$ and $f_2$ may be utilized to solve for $C_2$ 606 and R 602. In one or more embodiments, by measuring Z(f) at two frequencies, a changing R 602 or a changing $C_2$ 606 may be monitored. In one or more embodiments, in order to maximize sensitivity of the circuit, frequencies $f_1$ and $f_2$ may be selected such that $$R = \frac{1}{2\pi f C}.$$

In one or more embodiments, the circuit may include a power source (e.g., battery). In one or more embodiments, the circuit may be powered by an external interrogation device, i.e., the circuit may be passive. In one or more embodiments, the circuit may be semi-passive in that the battery may be utilized to operate the internal components of the circuit, and to actively transmit seal 300 status periodically, and the external interrogation device may be used to activate (e.g., arm) the circuit. Therefore, in one or more embodiments, the external interrogation device and/or the reception of shackle 304 inside housing 302 may activate the circuit. In one or more embodiments, the semi-passive circuit may aid in the conservation of battery power. In one or more embodiments, the displacement of shackle 304 may be monitored, following the arming of the circuit, as the displacement changes the resistance of shackle 304 and, hence, the length of shackle 304 between the conductive terminals (502, 504). In one or more embodiments, the change in length may also indicate tampering.

In one or more embodiments, shackle 304 may be a cable, one end of which may be coupled to another coupling mechanism in the unlocked state. In one or more embodiments, during reception of the other end of shackle 304 (e.g., cable) inside housing 302, shackle 304 may be locked by the locking mechanism. In one or more embodiments, the other end of shackle 304 may then protrude outside housing 302, as discussed above.

In one or more embodiments, the locking mechanisms mentioned above may be made of robust steel or iron, which, in turn, may be machine or cast. In one or more embodiments, shackle 304 may not be withdrawn in a direction opposite to that of the reception inside housing 302, as the locking mechanism may prevent shackle 304 displacement in both the aforementioned directions during the locked state.

Figure 7:
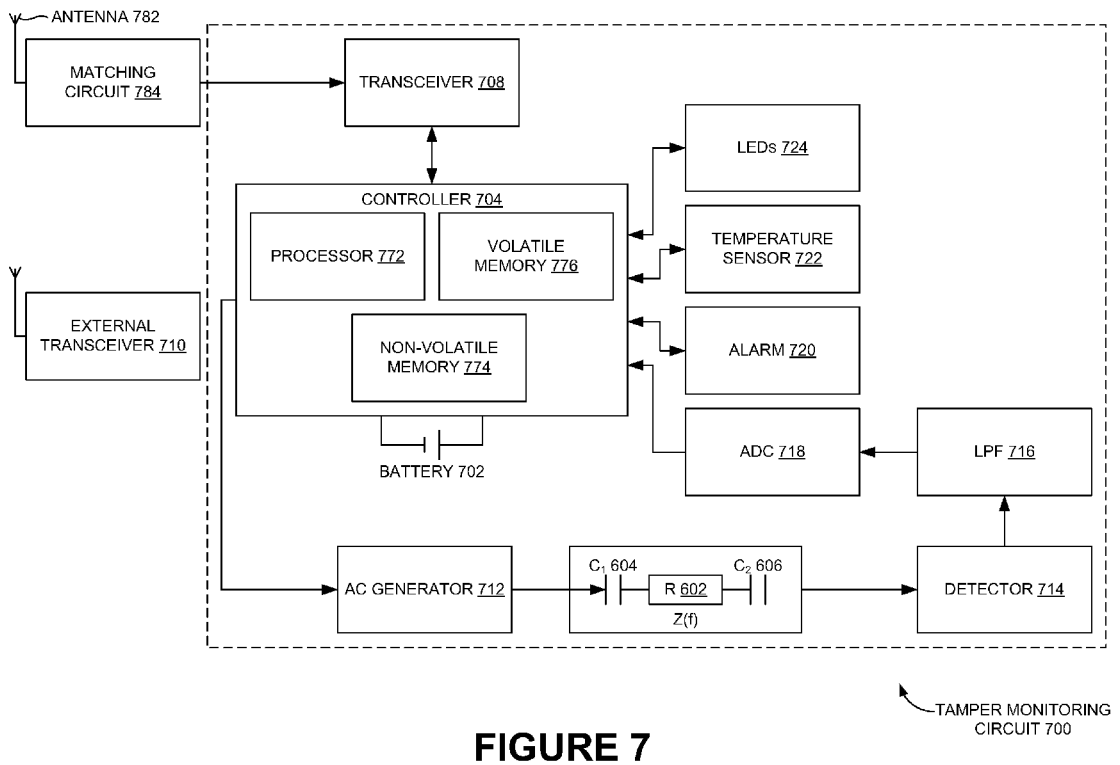
FIG. 7 is a schematic view of a tamper monitoring circuit, according to one or more embodiments.

FIG. 7 shows a schematic view of tamper monitoring circuit 700, according to one or more embodiments. In one or more embodiments, tamper monitoring circuit 700 may be armed by the reception of shackle 304 inside housing 302, which may cause shackle 304 to come in contact with conductive terminals (502, 504), whereupon battery 702 is established as the power source. In one or more embodiments, tamper monitoring circuit 700 may include a controller 704 configured to control operations of circuit components therein. In one or more embodiments, controller 704 may include a processor 772, a non-volatile memory 774 (e.g., an Erasable Programmable Read-Only Memory (EPROM)), and a volatile memory 776 (e.g., Random Access Memory (RAM)). In one or more embodiments, controller 704 may also include a clock (not shown) configured to provide a time-stamp associated with seal 300 tamper events, and external query responses.

In one or more embodiments, tamper monitoring circuit 700 may include a transceiver 708 interfaced with controller 704, and configured to enable tamper monitoring circuit 700 to be queried by an external transceiver 710. In one or more embodiments, AC generator 712, which is interfaced with controller 704, may be configured to generator AC signals at different frequencies. In one or more embodiments, AC generator 712 may include a Pulse Width Modulator (PWM) and a Low Pass Filter (LPF). In one or more embodiments, PWM may be configured to generate digital signals associated with different frequencies, and AC generator 712 may then be configured to convert the digital signals to sinusoidal waves, whose higher harmonics are filtered by the LPF.

In one or more embodiments, the sinusoidal waves may then be applied at terminal 502. In one or more embodiments, the equivalent impedance, Z(f), discussed above may be the impedance between terminal 502 and terminal 504. In one or more embodiments, terminal 504 may be coupled to a detector 714 (e.g., Amplitude Modulation (AM) detector). In one or more embodiments, detector 714 may include a diode and a capacitor in a simplest form thereof. In one or more embodiments, the diode may be a zero-bias diode or the diode may require a bias level for increased sensitivity. In one or more embodiments, the AC component of the detector 714 output may be suppressed through a Low Pass Filter (LPF) 716. In one or more embodiments, LPF 716 output may then be fed to an Analog-to-Digital Converter (ADC) 718 configured to convert LPF 716 output to discrete values compatible with processing performed by processor 772 of controller 704. In one or more embodiments, volatile memory 776 may be configured to store algorithms associated with analyzing the abovementioned discrete values and performing other processing described herein.

In one or more embodiments, as discussed above, when shackle 304 is received inside housing 302 and contacts terminal 504 through a tightening thereof, the tamper monitoring circuit 700 may be armed by way of an electrical coupling being established between the circuit elements and battery 702. Alternately, external transceiver 710 may issue an arm command to controller 704 following the tightening described above. It is obvious that tamper monitoring circuit 700 may be armed internally/externally upon reception of bolt 204 inside housing 202 in case of seal 200. Here, the tamper condition may be manifested in a different manner, and modifications therein are well within the scope of the exemplary embodiments.

In one or more embodiments, transceiver 708, which will be described below, may also be configured to receive the arm command. In one or more embodiments, external transceiver 710 may have a configuration similar to transceiver 708, and, therefore, the description of transceiver 708 will suffice as the description of both transceiver 708 and external transceiver 710. In one or more embodiments, as soon as the arm command is received by controller 704 and external transceiver 710, a reference value of R 602 and $C_1$ 604/$C_2$ 606 may be measured and stored in volatile memory 776. In one or more embodiments, measurements may be performed periodically or upon querying by external transceiver 710. In one or more embodiments, reference values stored in volatile memory 776 may also be updated based on slow transitions due to environmental conditions.

In one or more embodiments, the equivalent impedance, Z(f), may be calculated based on the discrete values read by controller 704 (specifically, processor 772) as the output of ADC 718 corresponding to the signal at different frequencies. In one or more embodiments, the new impedance value may be compared to a reference impedance value calculated during storing of the reference values discussed above. In one or more embodiments, a tamper event may have an associated increased change (e.g., a change above a predetermined value) in the value of equivalent impedance, Z(f), and may be detected thereby.

In one or more embodiments, controller 704 may also be configured to determine if shackle 304/bolt 304 has been displaced, following the arming of tamper monitoring circuit 700. In one or more embodiments, as a change in the measured resistance, R 602, may be associated with the change in length of shackle 304, the change in resistance, R 602, may be utilized in the recognition of tampering. In one or more embodiments, integrity of shackle 304 may be monitored by applying a current through shackle 304 at two different frequencies. In one or more embodiments, as current at the output of ADC 718 may be proportional to Z(f), two different frequencies may be utilized to solve for R 602, $C_1$ 604, and $C_2$ 606.

In one or more embodiments, tamper monitoring circuit 700 may include a temperature sensor 722 configured to monitor ambient temperature at seal 200/300. In one or more embodiments, the ambient temperature may also be recorded therein. In one or more embodiments, in order to account for drift in Z(f) due to, for example, temperature variations, a mean value of Z(f) at the two frequencies may be measured and stored at the time of arming tamper monitoring circuit 700 in non-volatile memory 774. In one or more embodiments, the mean value may be utilized as a reference value for comparison during successive measurements timed by the clock (not shown) programmed into volatile memory 776. In one or more embodiments, depending on the deviation from a predetermined threshold value, a tamper alarm condition may be triggered, and an alarm 720 (e.g., audio alarm) may be generated. In one or more embodiments, alarm 720 may be controlled by controller 704.

In one or more embodiments, temperature sensor 722 may be interfaced with controller 704, which may be configured to account for both length changes in shackle 304 and diameter changes in shackle 304 due to temperature. In one or more embodiments, the temperature may be monitored by temperature sensor 722 periodically. In one or more embodiments, temperature sensor 722 may be configured to ensure that a change in conductivity of shackle 304 is due to a change in temperature rather than a tamper event. In one or more embodiments, false alarms may be avoided through the proper utilization of temperature sensor 722.

In one or more embodiments, a set of LEDs 724 configured to be controlled by controller 704 may provide visual indication of the status of seal 200/300. In one or more embodiments, a green LED may be utilized to indicate an armed state, and a red LED may be utilized to indicate a tamper condition sensed by controller 704. In one or more embodiments, as discussed above, tamper monitoring circuit 700 may be entirely passive, whereby battery 702 may be used to operate the internal components of tamper monitoring circuit 700 in addition to periodically transmitting status of seal 200/300. In one or more embodiments, the status transmission may occur regardless of receipt of an interrogation request from external transceiver 710. In one or more embodiments, as discussed above, tamper monitoring circuit 700 may be semi-passive, and may wake up and transmit seal 200/300 status only when activated by external transceiver 710. Therefore, in one or more embodiments, the semi-passive configuration may be preferred for battery 702 power saving purposes.

In one or more embodiments, in case of seal 200 of FIG. 2, the reception of bolt 204 inside housing 202 may arm tamper monitoring circuit 700, as discussed above. In one or more embodiments, when bolt 204 is inserted inside housing 202, an electrical coupling may be established between battery 702 and tamper monitoring circuit 700, again, as discussed above. In one or more embodiments, tamper monitoring circuit 700 may also be activated through external transceiver 710. In one or more embodiments, the insertion of bolt 204 inside housing 202 may cause controller 704 to generate a code associated with a locked seal 200. In one or more embodiments, transceiver 708 may be configured to transmit the first code to external transceiver 710. In one or more embodiments, when bolt 204 is inserted inside housing 202, electrical power may be applied to tamper monitoring circuit 700 at all times. In one or more embodiments, when bolt 204 is tampered (e.g., by severing bolt 204), a signal in tamper monitoring circuit 700 may be interrupted. In one or more embodiments, controller 704 may sense this aforementioned interruption, and transceiver 708 may be configured to transmit a code indicating a tampered state. In one or more embodiments, controller 704 may disable the code generation associated with the locked seal 200.

In one or more embodiments, controller 704 (specifically, processor 772) may be programmed to transmit a "tamper" message through transceiver 708 to external transceiver 710. In one or more embodiments, the "tamper" message may be accompanied with an alarm 720, the condition of which may also be read by external transceiver 710. In one or more embodiments, once the integrity of seal 200 is breached by way of the alarm condition being read by external transceiver 710, external transceiver 710 may store the seal identification number of seal 200.

In one or more embodiments, when a number of seals 200 are present (e.g., by way of a number of utility meters 1300 being in a building 1400), a number of signals may be transmitted in close proximity. In one or more embodiments the transmission of a number of signals may require secure communication through a protocol, which may "isolate" the signals from one another. In one or more embodiments, care may be taken to ensure that no interruption of tamper monitoring circuit 700 may occur once tamper monitoring circuit 700 is powered ON.

In one or more embodiments, tamper monitoring circuit 700 may be pre-programmed externally through a programming unit (not shown) with identification data associated with seal 200/300. In one or more embodiments, once bolt 204/shackle 304 is received inside housing 202/302, tamper monitoring circuit 700 program may not be changed. Therefore, in one or more embodiments, bolt 204/shackle 304 may be permanently locked into the locking mechanism, and removal thereof is not possible without destroying bolt 204/shackle 304 and/or seal 200/300. In one or more embodiments, it may be important that bolt 204/shackle 304 and conductive terminal contacts do not disengage due to environmental conditions such as unfavorable weather.

In one or more embodiments, external transceiver 710 may be handheld, and may be used to read transmission from transceiver 708. However, in one or more embodiments, external transceiver 710 may, preferably, be located in a control location associated with the utility meter 1300. In one or more embodiments, the control location associated with the utility meter 1300 may be at the same building 1400 as the utility meter 1300 or at an external location such as the service provider office or a secure non-office location under the purview of the service provider.

Figure 8:
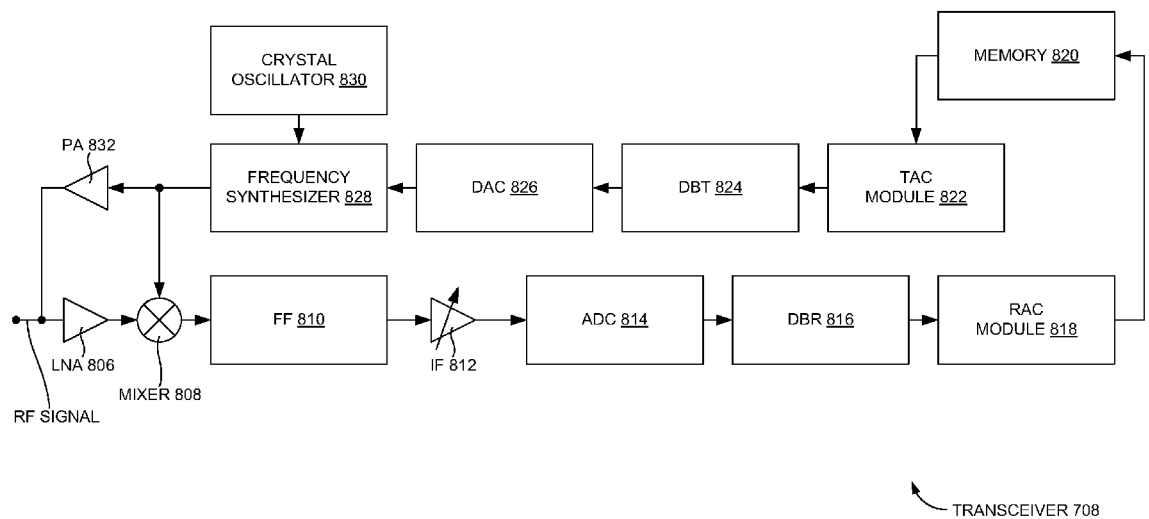
FIG. 8 is a schematic view of a transceiver configured to transmit to an external transceiver, according to one or more embodiments.

FIG. 8 shows a transceiver 708 configured to transmit to external transceiver 710, according to one or more embodiments. In one or more embodiments, as discussed above, the configurations of transceiver 708 and external transceiver 710 may be similar, and the description associated with transceiver 708 will suffice as the description associated with external transceiver 710. In one or more embodiments, an antenna 782 may be configured to transmit/receive signals associated with identification data of seal 200/300, tamper conditions, and/or status reports. In one or more embodiments, matching circuit 784 may serve to match impedance between antenna 782 and the input of transceiver 708. In one or more embodiments, therefore, matching circuit 784 (e.g., balun) may serve to transform the impedance at antenna 782 to the impedance at the input of transceiver 708.

In one or more embodiments, in the receive mode, transceiver 708 may be activated/queried by external transceiver 710, as discussed above. In one or more embodiments, the signal associated with the aforementioned functions may be amplified by Low Noise Amplifier (LNA) 806, which may be configured to suppress noise contributions from succeeding stages. In one or more embodiments, the output of LNA 806 is converted to a frequency difference signal, or, an Intermediate Frequency (IF) signal, through mixing (through mixer 808) with a Local Oscillator (e.g., crystal oscillator 830). In one or more embodiments, the output of LNA 806 may be mixed to the IF frequency using I and Q mixers. In one or more embodiments, the frequency difference signal/IF signal may then be passed through a Band-Pass Filter (BPF) (shown as Frequency Filter (FF) 810) in order to allow the IF band of interest to pass. In one or more embodiments, the output of FF 810 may then be amplified by a variable-gain IF amplifier (shown as IF 812), before being subjected to an analog-to-digital conversion through ADC 814.

In one or more embodiments, digital baseband receiver (DBR) 816 may be configured to receive the digitized output (e.g., Quadrature Phase-Shift Keying (QPSK) signal) of ADC 814, demodulate the digital signal, and to synchronize the demodulated signal with the preamble of a packet associated with a transmission protocol (e.g., IEEE 802.15.4) used for the two-way communication between transceiver 708 and external transceiver 710. In one or more embodiments, the preamble (e.g., a bit sequence) may allow synchronization of the receiver data clock to the transmitter data clock, and may enable further transmission from the node therein. In one or more embodiments, an automatic gain control (AGC) module (not shown) may adjust the IF gain (analog) (e.g., of IF 812) such that the preamble is detected. In one or more embodiments, the IF gain may be fixed during packet (i.e., packets associated with the demodulated digital signal and the transmission protocol used for the two-way communication) reception, following the detection of the preamble.

In one or more embodiments, DBR 816 may also de-spread the demodulated data into bit-symbols (e.g., 4-bit symbol), which may be buffered and transmitted to Receiver Access Control (RAC) module 818 for filtering purposes. In one or more embodiments, additionally, DBR 816 may be configured to provide calibration and control interface to the analog receiver modules such as LNA 806, and FF 810.

In one or more embodiments, during reception of packets, RAC module 818 may be configured to read bit-symbols from DBR 816. In one or more embodiments, RAC module 818 may be configured to then detect errors in the digital data (e.g., through a Cyclic Redundancy Check (CRC)). In one or more embodiments, a Frame Check Sequence (FCS) checker may perform the CRC on the received digital data. In one or more embodiments, RAC module 818 may then assemble the received digital data for storage in a memory 820 (e.g., RAM) buffer. In one or more embodiments, access may be provided to memory 820 through a Direct Memory Access (DMA). In one or more embodiments, additional data may be appended to the end of the packet stored in the memory 820 buffer in order to provide statistical packet information. In one or more embodiments, memory 820 may be interfaced with controller 704, which may be configured to appropriately respond to queries from external transceiver 710.

In one or more embodiments, non-intended packets may be filtered by hardware inside transceiver 708. In one or more embodiments, a DMA interface, as discussed above, may be provided to memory 820 in order to reduce interaction with controller 704 during transmission/reception of packets. In one or more embodiments, when data denoting identification data associated with seal 200/300, status reports, and/or tamper conditions discussed above is ready to be transmitted using transceiver 708 (i.e., transmit mode), controller 704 may transmit the appropriate packet data to memory 820, where the packet data may be stored in the memory 820 buffer. In one or more embodiments, the software stack associated with the transmission protocol may configure the DMA interface discussed above by indicating the location of the packet in the memory 820 buffer. In one or more embodiments, Transmitter Access Control (TAC) module 822, analogous to RAC module 818, may be configured to wait for the back-off period, during which the channel (i.e., frequency desired in frequency band of interest) is busy, and perform channel assessment.

In one or more embodiments, when the channel is clear, TAC module 822 may be configured to read the packet data from the memory 820 buffer, perform error detection (e.g., through calculating the CRC), and provide bit-symbols (e.g., 4-bit symbol) to the digital baseband transmitter (DBT) 824. In one or more embodiments, TAC module 822 may include a FCS generator and a packet retriever for the aforementioned purposes. In an example embodiment utilizing the IEEE 802.15.4 protocol stack, a Carrier Sense Multiple Access with Collision Avoidance (CSMA/CA) algorithm may be implemented and utilized as a component of TAC module 822. In one or more embodiments, only if a channel is "idle" or is "free," packet data may be transmitted to the DBT 824. In one or more embodiments, DBT 824 may be configured to spread the bit-symbols, and generate a digital modulation signal (e.g., QPSK modulation signal). In one or more embodiments, the digital modulation signal may be fed to a Digital-to-Analog Converter (DAC) 826 configured to perform the Digital-to-Analog conversion.

In one or more embodiments, the output of DAC 826 may be passed through frequency synthesizer 828 configured to convert the baseband signal output of DAC 826 to an RF signal. In one or more embodiments, frequency synthesizer 828 may be a fractional-N frequency synthesizer, whose internally generated frequencies are derived from the reference frequency of crystal oscillator 830. In one or more embodiments, crystal oscillator 830 may serve to generate other reference frequencies for transceiver 708. However, in one or more embodiments, another crystal oscillator may be utilized to generate, for example, a clock reference frequency. In one or more embodiments, the output of frequency synthesizer 828 may be amplified by a power amplifier (PA) 832. In one or more embodiments, as transceiver 708 is interfaced with antenna 782 through matching circuit 784, the signal denoting identification data associated with seal 200/300, status reports, and/or tamper conditions may then be transmitted to external transceiver 710.

The tamper monitoring circuit 700 may work in a synchronous mode or an asynchronous mode. In one or more embodiments, in the synchronous mode, the clock output of transceiver 708 may be used as the master clock of controller 704. In one or more embodiments, in the asynchronous mode, controller 704 may be configured to generate the master clock thereof. In one or more embodiments, a security engine (not shown) may be implemented in transceiver 708, whereby security keys may be stored in security key buffers of memory 820. In one or more embodiments, security keys may include one or more of encryption keys and a decryption key. In one or more embodiments, the security keys may be utilized to encrypt and decrypt frames associated with RAC module 818 and TAC module 822.

In one or more embodiments, all transceiver 708 components, except for the antenna 782, matching circuit 784, crystal (used in crystal oscillator 830), and capacitors therein may be integrated on a chip. In one or more embodiments, as seen above, transceiver 708 may be operated using controller 704. In one or more embodiments, the transmission protocol (e.g., IEEE 802.15.4) may define specifications for low data rate wireless connectivity with portable (e.g., handheld), non-portable but moving, and fixed devices. In one or more embodiments, the specifications may be for wireless personal area networks (WPANs). In one or more embodiments, the implementation of transceiver 708 (and, also, external transceiver 710) may provide for ease of installation, reliable data transfer, short-range operation, and prolonged battery 702 life.

In one or more embodiments, in the common scenario of there being multiple utility meters 1300 inside a building 1400, all the multiple utility meters 1300 and associated seals 200/300 may come under the purview of the same utility service provider. Therefore, in one or more embodiments, in order to avoid interference therein, transceiver 708 may not transmit automatically. In one or more embodiments, transceiver 708 may wait for a period of time before trying to transmit again or may move to another channel. In one or more embodiments, transmission may be acknowledged in order to provide for improved data reliability. In one or more embodiments, transceiver 708 and, hence, tamper monitoring circuit 700 may transmit and receive data based on ZigBee™ technology. ZigBee™ is a data transport technology based on the IEEE 802.15.4 standard for WPANs. In one example embodiment, the ZigBee™ technology based tamper monitoring circuit 700 of seal 200/300 may operate utilizing the 2.4 GHz frequency band. Alternately, in one or more embodiments, other bands of frequencies may be utilized to operate the ZigBee™ technology based tamper monitoring circuit 700 of seal 200/300.

In one or more embodiments, channel selection in a data transport format may allow for multiple seals 200/300 (i.e., tamper monitoring circuit 700 and, hence, transceiver 708) paired with an external transceiver 710. In one or more embodiments, external transceiver 710 may be part of an asset monitoring unit (AMU), and may be located within the LOS of the antenna 782 of transceiver 708. Therefore, in one or more embodiments, external transceiver 710 may be located in the same building 1400 as the utility meters 1300 or at a location outside the building 1400, as discussed above.

In one or more embodiments, other formats such as Worldwide Interoperability for Microwave Access (WiMAX™), WiFi™, and Bluetooth™ may be utilized instead of ZigBee™ technology, and such variations are within the scope of the exemplary embodiments disclosed herein.

Figure 9:
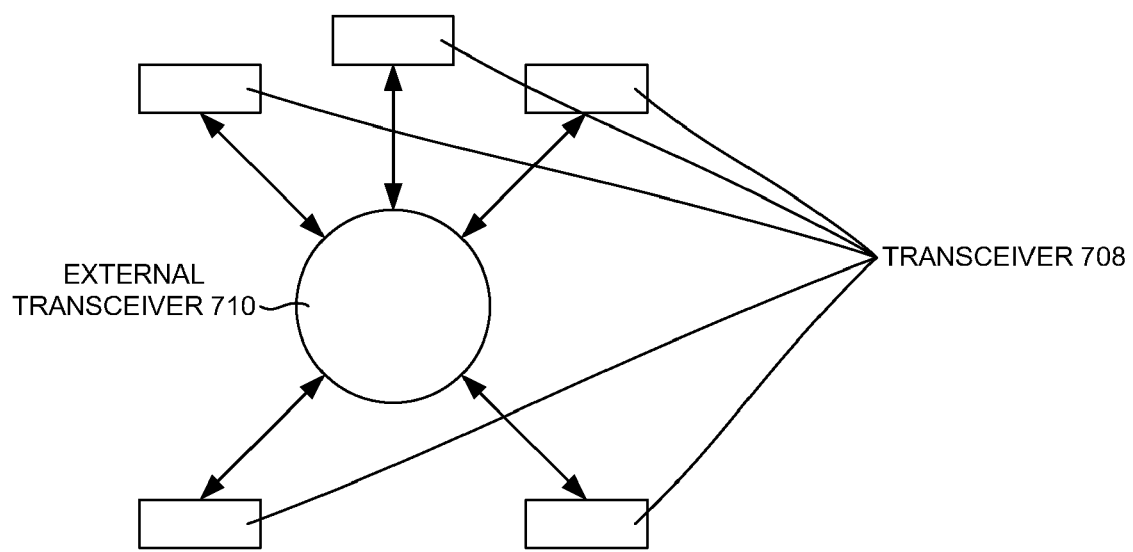
FIG. 9 is a system view of a star topology of a wireless network, according to one or more embodiments.

In one or more embodiments, a wireless network including seals 200/300 (i.e., transceivers 708) as nodes therein may include external transceiver 710 as a gateway. In one or more embodiments, external transceiver 710 may be configured to communicate with the nodes (i.e., transceivers 708). In one or more embodiments, data from a transceiver 708 may be transmitted directly to external transceiver 710 and/or via other transceivers 708. FIG. 9 shows a star topology of a wireless network, according to one or more embodiments. In one or more embodiments, external transceiver 710, i.e., the gateway, may be configured to send/receive data to/from a number of transceivers 708, whereas a transceiver 708 may only be configured to send/receive data from external transceiver 710. In one or more embodiments, external transceiver 710 obviously then may have to be within the radio transmission range of the individual transceivers 708. In one or more embodiments, the star topology, however, may not be as robust as other network topologies due to the heavy dependence on external transceiver 710.

Figure 10:
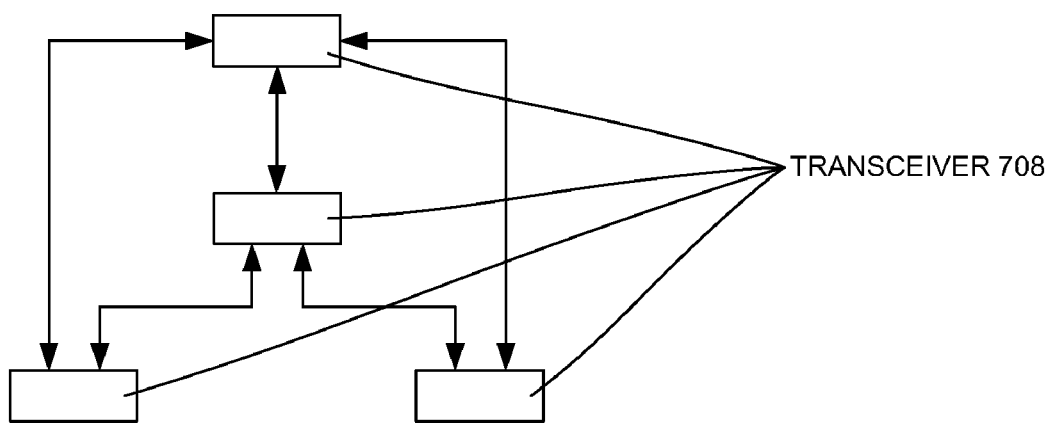
FIG. 10 is a system view of a mesh topology of the wireless network, according to one or more embodiments.

FIG. 10 shows a mesh topology of the wireless network, according to one or more embodiments. In one or more embodiments, any node (i.e., transceiver 708) in the wireless network may transmit to any other node (i.e., transceiver 708) therein, provided the other node (i.e., transceiver 708) is within the radio transmission range. In one or more embodiments, if a transceiver 708 wants to transmit to external transceiver 710 (not shown) or another transceiver 708 that may be out of the radio transmission range, then data associated with the transmission may be forwarded via an intermediate node (i.e., transceiver 708). In one or more embodiments, this may provide for redundant and scalable multi-hop communication. In one or more embodiments, the range of the wireless network may be extended by adding more nodes (i.e., transceivers 708). In one or more embodiments, however, the power consumption in the wireless network and the time to transmit data may be higher compared to the star topology of the wireless network.

Figure 11:
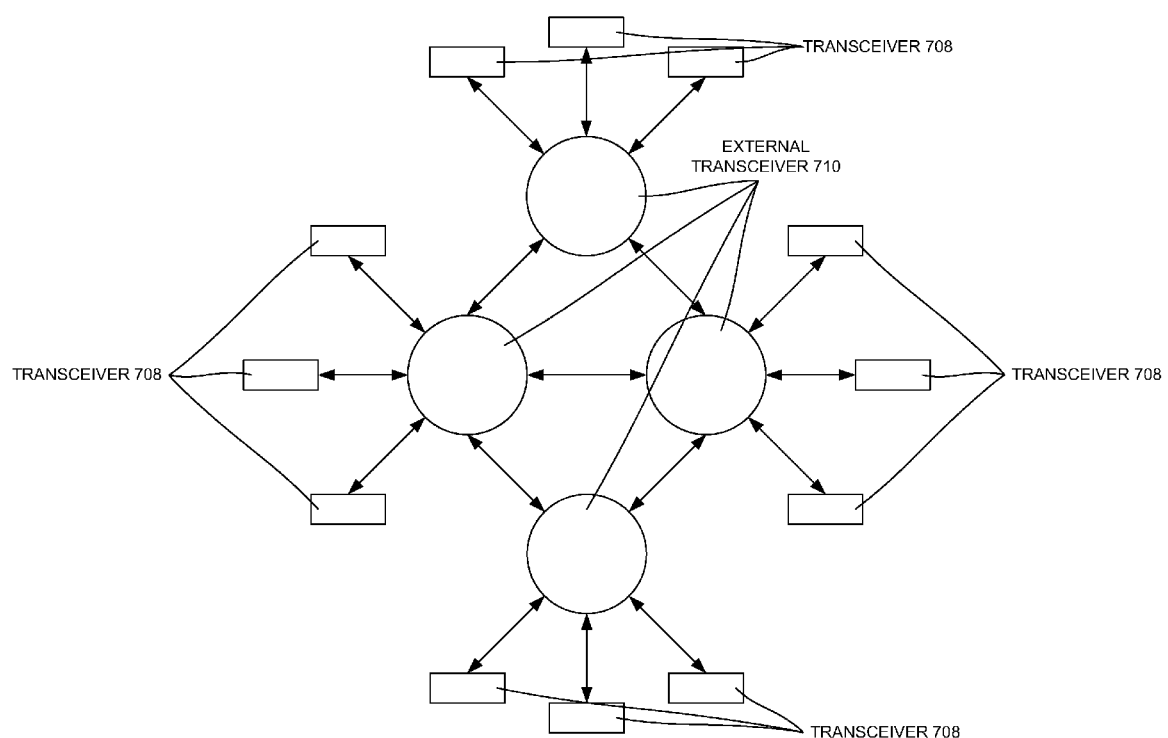
FIG. 11 is a system view of a hybrid star-mesh topology of the wireless network, according to one or more embodiments.

FIG. 11 shows a hybrid star-mesh topology of the wireless network, according to one or more embodiments. In one or more embodiments, the hybrid star-mesh topology may provide for robustness of the wireless network and low power consumption in the wireless network. In one or more embodiments, the nodes (e.g., transceivers 708) may not be provided with the ability to forward data to other nodes (e.g., transceivers 708). Here, in one or more embodiments, the nodes may only be configured to transmit/receive to/from the gateways (e.g., external transceiver 710). In one or more embodiments, each gateway (e.g., external transceiver 710) may have multiple nodes (e.g., transceiver 708) associated therewith. In one or more embodiments, as the topology may include multiple gateways (e.g., external transceivers 710), individual gateways (e.g., external transceivers 710) may be configured to transmit/receive data not only to/from multiple nodes (e.g., transceivers 708) but also to/from other gateways (e.g., external transceivers 710) within the radio transmission range (e.g., LOS). Therefore, in one or more embodiments, the hybrid star-mesh topology provides for increased fault tolerance.

In one or more embodiments, in the hybrid star-mesh topology, utility meters 1300 in different buildings 1400 (e.g., neighboring buildings) may be under the purview of the same utility service provider. Therefore, in one or more embodiments, external transceivers 710 associated with utility meters in different buildings 1400 may communicate with one another. In one or more embodiments, data may then be forwarded to a local collection node (e.g., a computer) via the networked external transceivers 710. In one or more embodiments, the local collection node may then transmit appropriate data to a central server having a database to store/index records. In one or more embodiments, status reports (e.g., tampering condition, history of operations performed/tampering with time-stamps of all events) may be generated at the location of the central server and/or the local collection node. In one or more embodiments, appropriate actions may be taken based on the data received at the local collection node/central server. In one or more embodiments, the actions may include but are not limited to modifying the customer usage/billing based on the repercussions of the tampering, replacing seal 200/300, and replacing the utility meter 1300.

For example, seals 200/300 associated with utility meters 1300 may be configured to communicate status thereof to a utility payment server. The external transceivers 710, then, may be associated with the utility payment server. The utility payment server may be communicatively coupled to utility meters 1300 associated with physical structures (e.g., buildings 1400) through a computer network.

Figure 12:
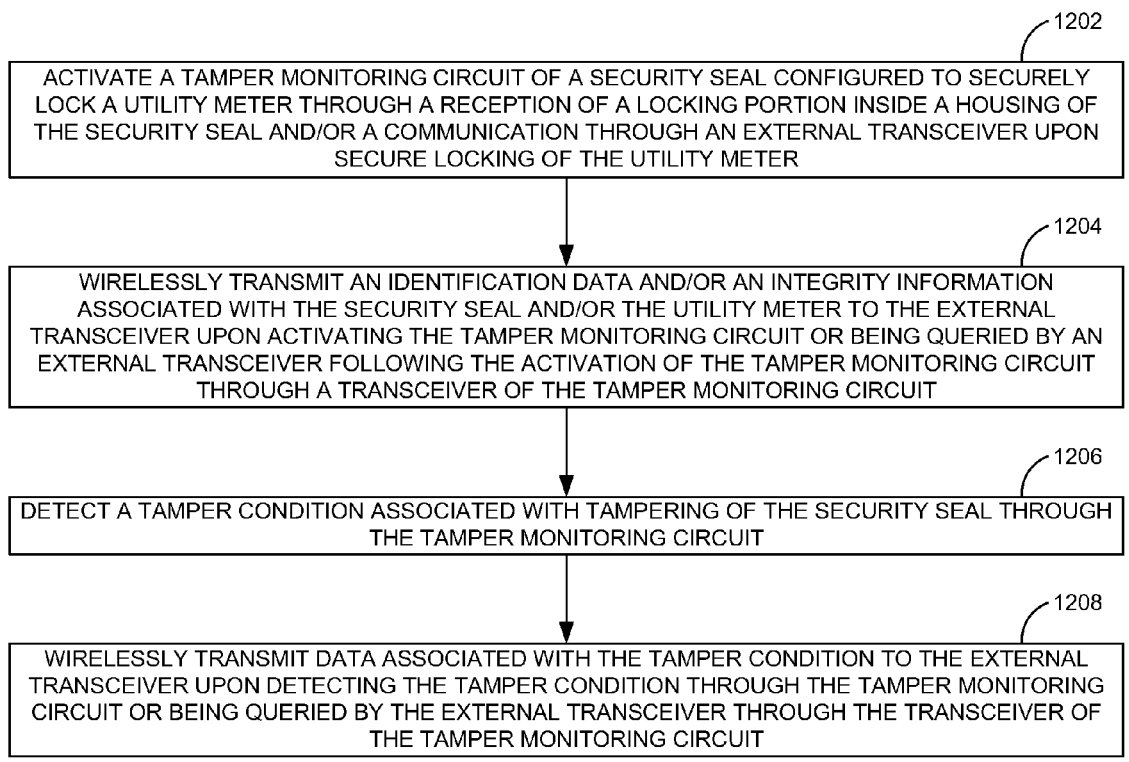
FIG. 12 is a process flow diagram detailing the operations involved in a method of monitoring tampering of a seal associated with a utility meter, according to one or more embodiments.

FIG. 12 shows a process flow diagram detailing the operations involved in a method of monitoring tampering of seal 200/300 associated with a utility meter 1300, according to one or more embodiments. In one or more embodiments, operation 1202 may involve activating a tamper monitoring circuit 700 of a seal 200/300 configured to securely lock a utility meter 1300 through a reception of a locking portion (e.g., bolt 204/a free end of a shackle 304) inside a housing of the seal 200/300 and/or a communication through an external transceiver 710 upon secure locking of the utility meter 1300. In one or more embodiments, the reception of the locking portion (e.g., bolt 204/the free end of the shackle 304) inside the housing 202/302 of the seal 200/300 may cause a conductive material of the locking portion (e.g., bolt 204/the free end of the shackle 304) to contact a conductive portion of the tamper monitoring circuit 700 to complete an electrical coupling between a power source of the tamper monitoring circuit 700 and the tamper monitoring circuit 700.

In one or more embodiments, operation 1204 may involve wirelessly transmitting an identification data and/or an integrity information associated with the seal 200/300 and/or the utility meter 1300 to the external transceiver 710 upon activating the tamper monitoring circuit 700 or being queried by the external transceiver 710 following the activation of the tamper monitoring circuit 700 through a transceiver 708 of the tamper monitoring circuit 700. In one or more embodiments, the transceiver 708 of the tamper monitoring circuit 700 and the external transceiver 710 may be configured to securely communicate with each other through a protocol configured to enable the transceiver 708 of the tamper monitoring circuit 700 and the external transceiver 710 to wait for a period of time when a channel is busy before attempting to transmit through the channel or transmit using another channel when the channel is busy.

In one or more embodiments, the channel may signify a frequency in a frequency band of communication between the transceiver 708 of the tamper monitoring circuit 700 and the external transceiver 710. In one or more embodiments, operation 1206 may involve detecting a tamper condition associated with tampering of the seal 200/300 through the tamper monitoring circuit 700. In one or more embodiments, operation 1208 may then involve wirelessly transmitting data associated with the tamper condition upon detecting the tamper condition through the tamper monitoring circuit 700 or being queried by the external transceiver 710 through the transceiver 708 of the tamper monitoring circuit 700.

Figure 13:
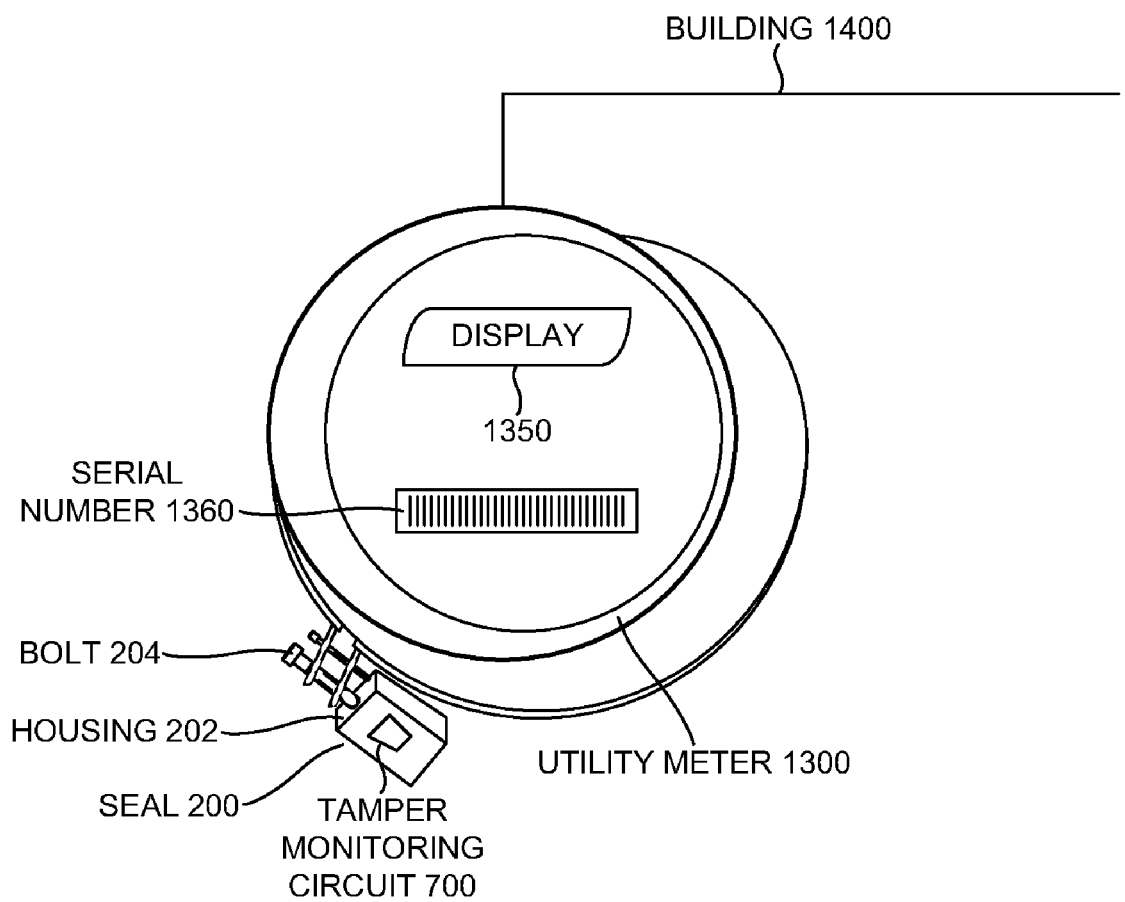
FIG. 13 is a schematic view of a utility meter locked using the seal of FIG. 2, according to one or more embodiments.

FIG. 13 shows a utility meter 1300 locked using seal 200, according to one or more embodiments. In one or more embodiments, utility meter 1300 may be associated with a building 1400. In one or more embodiments, utility meter 1300 may include a display 1350 configured to display numerals associated with customer usage of resources, and a serial number 1360 associated therewith. In one or more embodiments, bolt 204 may pass through locking hasps of utility meter 1300 to be received inside housing 202 of seal 200. In one or more embodiments, this may securely lock utility meter 1300. FIG. 13 also shows tamper monitoring circuit 700 configured to communicate a condition associated with tampering of seal 200.

Figure 14:
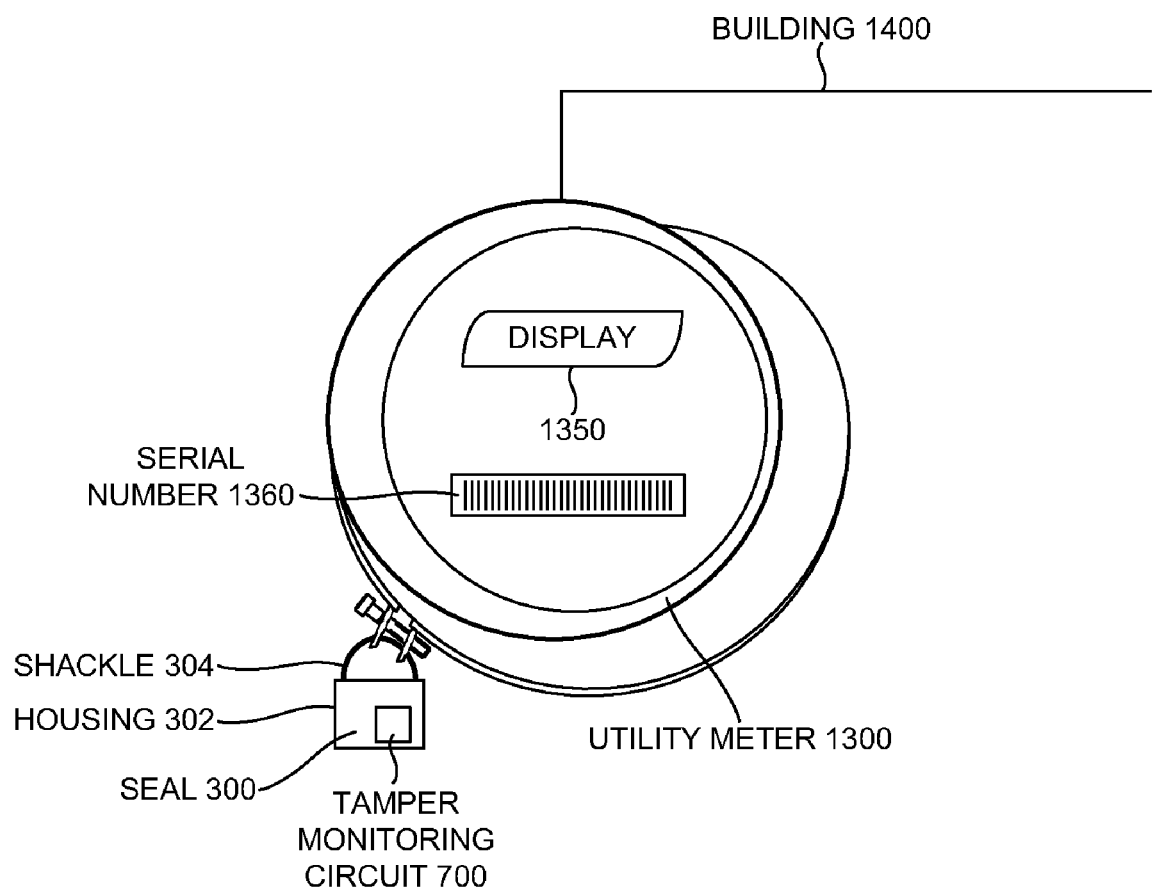
FIG. 14 is a schematic view of a utility meter locked using the seal of FIG. 3, according to one or more embodiments.

FIG. 14 shows utility meter 1300 locked using seal 300, according to one or more embodiments. Here, in one or more embodiments, shackle 304 may pass through locking hasps of utility meter 1300, and the free end of shackle 304 may be received inside housing 302 of seal 300. In one or more embodiments, this may securely lock utility meter 1300.

Figure 15:
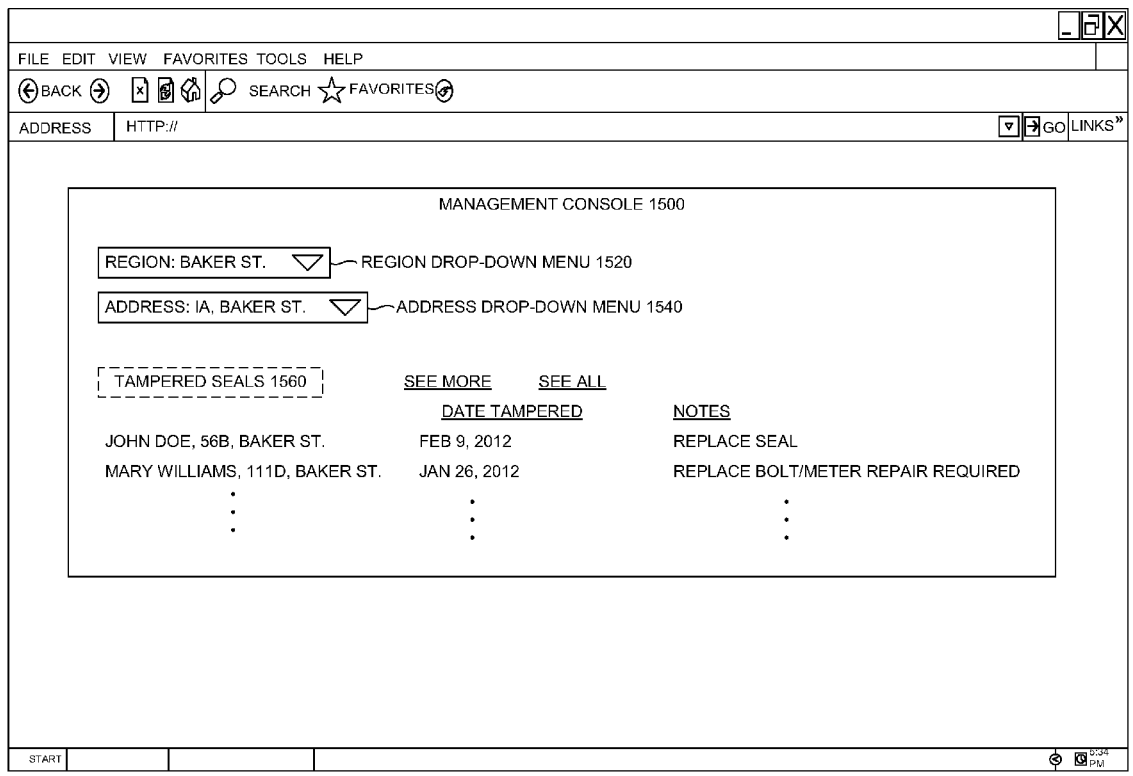
FIG. 15 is an illustrative view of a management console associated with tracking seal tampering, according to one or more embodiments.

FIG. 15 shows a management console 1500 associated with tracking tampering of seal 200/300, according to one or more embodiments. In one or more embodiments, management console 1500 may be part of the utility payment server and/or the local collection node to which utility meter 1300 data may be transferred. In one or more embodiments, management console 1500 may be accessed through an Internet browser, and may serve as a user interface. FIG. 15 illustrates a management console 1500 associated with a region/small city. In one or more embodiments, management console 1500 may include a region drop-down menu 1520, from which particular regions (e.g., a street) may be accessed. In one or more embodiments, addresses in regions may be accessed through address drop-down menu 1540. In one or more embodiments, tampered seals 1560 (or utility meters 1300) may then be listed in order of preference. For example, the addresses associated with tampered utility meters 1300 may be listed, along with the date and extent of tampering.

In one or more embodiments, the drop-down menus may be replaced by a list of all elements. In one or more embodiments, the serial numbers of tampered utility meters 1300 may be accessed through management console 1500. It is obvious that modifications of management console 1500 to suit the volume of data, analysis requirements and/or readability and other variations are within the scope of the exemplary embodiments.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry (e.g., CMOS based logic circuitry), firmware, software or any combination of hardware, firmware, and software (e.g., embodied in a machine-readable medium).

In addition, it will be appreciated that the various operations, processes, and methods disclosed herein may be embodied in a machine-readable medium and/or a machine accessible medium compatible with a data processing system (e.g., a computer device), and may be performed in any order (e.g., including using means for achieving the various operations). Accordingly, the specification and drawings are to be regarded in an illustrative rather than a restrictive sense.

What is claimed is:

1. A method comprising:
   activating a tamper monitoring circuit of a seal configured to securely lock a utility meter through at least one of:
      a reception, inside a housing of the seal, of a locking portion,
      the reception to cause a conductive material of the locking portion to contact a conductive portion of the tamper monitoring circuit to complete an electrical coupling between a power source of the tamper monitoring circuit and the tamper monitoring circuit,
      wherein the locking portion is one of a bolt and a free end of a shackle,
      wherein a non-free end of the shackle is configured to be coupled to the housing of the seal prior to reception of the free end of the shackle inside the housing in the securely locked state of the seal,
      a communication through an external transceiver upon secure locking of the utility meter;
   wirelessly transmitting at least one of an identification data and an integrity information associated with at least one of the seal and the utility meter to the external transceiver upon one of activating the tamper monitoring circuit and being queried by the external transceiver following the activation of the tamper monitoring circuit through a transceiver of the tamper monitoring circuit, the transceiver of the tamper monitoring circuit and the external transceiver being configured to securely communicate with each other through a protocol configured to enable the transceiver of the tamper monitoring circuit and the external transceiver to one of wait for a period of time when a channel is busy before attempting to transmit through the channel and transmit using another channel when the channel is busy,
      wherein the channel signifies a frequency in a frequency band of communication between the transceiver of the tamper monitoring circuit and the external transceiver;
   detecting a tamper condition associated with tampering of the seal through the tamper monitoring circuit;
   wirelessly transmitting data associated with the tamper condition to the external transceiver upon one of detecting the tamper condition through the tamper monitoring circuit and being queried by the external transceiver through the transceiver of the tamper monitoring circuit;
   transmitting at least one of a status of the seal, a query response to a query from the external transceiver, and the data associated with the tampering of the seal through a controller of the tamper monitoring circuit to the transceiver of the tamper monitoring circuit; and
   routing a query from the external transceiver through the transceiver of the tamper monitoring circuit to the controller of the tamper monitoring circuit.

2. The method of claim 1, further comprising:
   suppressing a noise contribution to an input to the transceiver from a component of the transceiver stage through a Low Noise Amplifier (LNA);
   converting an output of the LNA to a frequency difference signal through frequency mixing with a local oscillator in the transceiver stage;
   transmitting a frequency band of interest through filtering the frequency difference signal;
   amplifying the filtered output through a variable-gain amplifier;
   converting the output of the variable-gain amplifier from an analog format to a digital format;
   demodulating the digitized signal through a digital baseband receiver of the transceiver;
   synchronizing the demodulated digitized signal with the preamble of a packet associated with the protocol utilized for the communication between the transceiver of the tamper monitoring circuit and the external transceiver;
   de-spreading the demodulated digital data into bit-symbols;
   transmitting the bit-symbols to a Receiver Access Control (RAC) module in the transceiver, the RAC module being configured to detect errors in the digital data;
   assembling the received digital data for storage in a memory buffer of the transceiver; and
   interfacing the memory buffer of the transceiver to the controller,
   during the receive mode of operation of the transceiver of the tamper monitoring circuit.

3. The method of claim 2, further comprising:
   transmitting data associated with the at least one of the status of the seal, the query response to the query from the external transceiver, and the data associated with the tampering of the seal through the controller of the tamper monitoring circuit to the memory buffer of the transceiver;
   performing channel assessment using the Transmission Access Control (TAC) module, the TAC module being configured to the one of wait for the time period during which channel is busy and utilize another channel for transmission;
   one of reading the data from the memory buffer when the channel is clear and reading the data from the memory buffer utilizing another channel, performing error detection on the data, and providing bit-symbols to a digital baseband transmitter through the TAC module;
   spreading the bit-symbols through the digital baseband transmitter to generate a digital modulation signal;
   converting the digital output of the digital baseband transmitter to an analog format;
   transmitting the output of the digital-to-analog conversion through a frequency synthesizer configured to convert the baseband signal output of the digital-to-analog conversion to a Radio Frequency (RF) signal;
   amplifying the output of the frequency synthesizer through a power amplifier; and
   transmitting the output of the power amplifier through the antenna to the external transceiver,
   during the transmit mode of operation of the transceiver of the tamper monitoring circuit.

4. A tamper monitoring system comprising:

a wireless network comprising a plurality of external transceivers as gateways thereof and a plurality of seals associated with each external transceiver,
- wherein the plurality of external transceivers is configured such that individual external transceivers communicate data not only between the plurality of seals associated therewith but also between other external transceivers within a mutual radio transmission range,
- wherein each seal comprises:
  - a housing;
  - a locking portion configured to securely lock a utility meter through a reception thereof inside the housing,
    - wherein the locking portion is one of a bolt and a free end of a shackle
    - wherein the non-free end of the shackle is configured to be coupled to the housing prior to the reception of the locking portion inside the housing in the secure locked state of the seal; and
  - a tamper monitoring circuit configured to be activated through at least one of the reception of the locking portion inside the housing and a communication through the external transceiver associated therewith upon secure locking of the utility meter, the tamper monitoring circuit comprising:
    - a transceiver configured to wirelessly transmit at least one of an identification data and an integrity information associated with at least one of the security seal and the utility meter associated therewith to the external transceiver associated therewith upon one of activating the tamper monitoring circuit and being queried by the external transceiver associated therewith following the activation of the tamper monitoring circuit,
- wherein the transceiver of the tamper monitoring circuit and the external transceiver associated therewith are configured to securely communicate with one another through a protocol configured to enable the transceiver of the tamper monitoring circuit and the external transceiver associated therewith to one of wait for a period of time when a channel is busy before attempting to transmit through the channel and transmit using another channel when the channel is busy,
- wherein the channel signifies a frequency in a frequency band of communication between the transceiver of the tamper monitoring circuit and the external transceiver associated therewith,
- wherein the tamper monitoring circuit is configured to detect a tamper condition associated with tampering of the security seal, and
- wherein the transceiver of the tamper monitoring circuit is configured to wirelessly transmit data associated with the tamper condition to the external transceiver associated therewith upon one of detecting the tamper condition through the tamper monitoring circuit and being queried by the external transceiver associated therewith.

* * * * *